(12) United States Patent
Lee et al.

(10) Patent No.: US 11,132,087 B2
(45) Date of Patent: Sep. 28, 2021

(54) DISPLAY DEVICE

(71) Applicant: Samsung Display Co., LTD., Yongin-si (KR)

(72) Inventors: Hyunjoo Lee, Cheongju-si (KR); Jun-Woo Kim, Hwaseong-si (KR); Dae Won Kim, Seongnam-si (KR); ShiYong Kim, Seongnam-si (KR); Kee Hyun Nam, Seoul (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 16/861,217

(22) Filed: Apr. 29, 2020

(65) Prior Publication Data

US 2020/0393931 A1     Dec. 17, 2020

(30) Foreign Application Priority Data

Jun. 14, 2019  (KR) .................... 10-2019-0071037
Jul. 10, 2019  (KR) .................... 10-2019-0083429

(51) Int. Cl.
*G06F 3/041*     (2006.01)
*G09G 3/3233*    (2016.01)

(52) U.S. Cl.
CPC .......... *G06F 3/0418* (2013.01); *G06F 3/0412* (2013.01); *G06F 2203/04102* (2013.01); *G09G 3/3233* (2013.01); *G09G 2320/0233* (2013.01); *G09G 2320/0242* (2013.01); *G09G 2320/048* (2013.01); *G09G 2330/021* (2013.01); *G09G 2360/144* (2013.01); *G09G 2380/02* (2013.01)

(58) Field of Classification Search
None
See application file for complete search history.

(56) References Cited

U.S. PATENT DOCUMENTS

| | | | |
|---|---|---|---|
| 9,298,221 B2 | 3/2016 | Choi et al. | |
| 10,042,394 B2 | 8/2018 | Myung et al. | |
| 10,297,785 B2 | 5/2019 | Ahn et al. | |
| 10,398,048 B2 | 8/2019 | Jeon | |
| 10,497,306 B2 | 12/2019 | Lee | |
| 10,754,382 B2* | 8/2020 | Nam ................ | H05K 5/0017 |
| 2006/0146488 A1* | 7/2006 | Kimmel ............ | G06F 1/1616 |
| | | | 361/679.04 |

(Continued)

FOREIGN PATENT DOCUMENTS

| JP | 2015176057 A | 10/2015 |
|---|---|---|
| KR | 1020150077999 A | 7/2015 |

(Continued)

*Primary Examiner* — Dorothy Harris
(74) *Attorney, Agent, or Firm* — Cantor Colburn LLP

(57) ABSTRACT

A display device includes a display panel, a folding information detector, a control module, and a distortion compensator. The display panel displays an image and includes a folding area folded with respect to an imaginary folding axis and a plurality of non-folding areas adjacent to the folding area when viewed in a plan view. The folding information detector detects folding information about the display panel, and a control module outputs a control signal based on the folding information provided from the folding information detector. The distortion compensator compensates for a distortion of the image displayed through the folding area in response to the control signal.

24 Claims, 26 Drawing Sheets

(56) References Cited

U.S. PATENT DOCUMENTS

| | | | |
|---|---|---|---|
| 2010/0060548 A1* | 3/2010 | Choi | G06F 3/04886 |
| | | | 345/1.3 |
| 2012/0092363 A1* | 4/2012 | Kim | G06F 3/147 |
| | | | 345/618 |
| 2012/0235894 A1* | 9/2012 | Phillips | G09G 3/36 |
| | | | 345/156 |
| 2013/0265257 A1* | 10/2013 | Jung | G06F 3/038 |
| | | | 345/173 |
| 2013/0321264 A1* | 12/2013 | Park | G06F 3/011 |
| | | | 345/156 |
| 2017/0025059 A1* | 1/2017 | Lu | G06F 1/1652 |
| 2018/0102096 A1* | 4/2018 | Lee | G09G 3/3266 |
| 2018/0150108 A1* | 5/2018 | Song | H05K 1/028 |
| 2020/0152136 A1* | 5/2020 | Jeon | G09G 3/3275 |
| 2020/0265799 A1* | 8/2020 | Choi | G01B 7/30 |

FOREIGN PATENT DOCUMENTS

| | | |
|---|---|---|
| KR | 1020160083789 A | 7/2016 |
| KR | 1020170003801 A | 1/2017 |
| KR | 1020180031893 A | 3/2018 |
| KR | 1020190037585 A | 4/2019 |

\* cited by examiner

| Cumulative folding count \ Cumulative folding time | k Time | 2k Time | 3k Time | 4k Time |
|---|---|---|---|---|
| n | 40.1μm | 40.2μm | 40.3μm | 40.4μm |
| 2n | 40.2μm | 40.3μm | 40.4μm | 40.5μm |
| 3n | 40.3μm | 40.4μm | 40.5μm | 40.6μm |
| 4n | 40.4μm | 40.5μm | 40.6μm | 40.7μm |
| 5n | 40.5μm | 40.6μm | 40.7μm | 40.8μm |
| 6n | 40.6μm | 40.7μm | 40.8μm | 40.9μm |
| 7n | 40.7μm | 40.8μm | 40.9μm | 41μm |

DISPLAY DEVICE

This application claims priority to Korean Patent Application Nos. 10-2019-0071037, filed on Jun. 14, 2019, and 10-2019-0083429, filed on Jul. 10, 2019, and all the benefits accruing therefrom under 35 U.S.C. § 119, the contents of which in their entireties are herein incorporated by reference.

BACKGROUND

1. Field

The disclosure relates to a display device. More particularly, the disclosure relates a display device having improved display quality in a folding area.

2. Description of the Related Art

In recent years, a display panel that is bendable or foldable (hereinafter, referred to as a "flexible display module) is being developed. The flexible display module typically includes a flexible display panel and a variety of functional members. The flexible display panel includes a base member, a variety of functional layers disposed on the base member, and pixels disposed on the base member.

A rollable or foldable display device may include the flexible display module.

SUMMARY

The disclosure provides a display device with improved display quality by a flexural strain in a folding area.

An embodiment of the invention provides a display device including a display panel which displays an image, where the display panel includes a folding area folded with respect to an imaginary folding axis and a plurality of non-folding areas adjacent to the folding area when viewed in a plan view, a folding information detector which detects folding information about the display panel, a control module which outputs a control signal based on the folding information provided from the folding information detector, and a distortion compensator which compensates for a distortion of the image displayed through the folding area in response to the control signal.

In an embodiment, the folding information detector may include a measuring unit which measures cumulative information about a folding operation of the display panel, a folding information generating unit which generates the folding information based on the cumulative information, and a folding information storing unit which stores unit storing the folding information.

In an embodiment, the measuring unit may include a cumulative time measuring unit which measures a cumulative folding time of the display panel.

In an embodiment, the measuring unit may further include a cumulative count measuring unit which measures a cumulative folding count of the display panel.

In an embodiment, the folding information generating unit may further include a lookup table in which a strain amount is stored based on the folding time and the folding count, and the folding information generating unit may read out a corresponding strain amount from the lookup table based on the cumulative folding time and the cumulative folding count and outputs the corresponding strain amount read out from the lookup table as the folding information.

In an embodiment, the measuring unit may further include a strain sensor disposed on the display panel, and the cumulative time measuring unit and the cumulative count measuring unit may respectively calculate the cumulative folding time and the cumulative folding count based on a value measured by the strain sensor.

In an embodiment, the display device may further include an input sensing unit disposed on the display panel, and the strain sensor may be disposed in the input sensing unit.

In an embodiment, the distortion compensator may include a lookup table in which compensation data corresponding to the folding information are stored, and a compensator which receives image data, receives the compensation data from the lookup table, and outputs synthesized data obtained by synthesizing the compensation data and the image data.

In an embodiment, the distortion compensator may further include a comparator which compares the folding information with a predetermined reference value, the compensator may be turned off when the folding information is smaller than the predetermined reference value, and the compensator may be turned on when the folding information is greater than the predetermined reference value.

In an embodiment, the compensation data may be data set to allow a predetermined compensation pattern to be displayed in the folding area.

In an embodiment, the compensation data may be data set to allow a predetermined image to be displayed in the folding area.

In an embodiment, the display device may further include a lower frequency driving controller which outputs a power control signal based on a normal operation mode operating at a reference frequency or a low frequency operation mode operating at a frequency lower than the reference frequency.

In an embodiment, the display device may further include a data driver connected to the display panel, where the display panel may include a pixel connected to a gate line and a data line, and the data driver may output a data signal to the data line and operate in the low frequency operation mode by the power control signal.

In an embodiment, the distortion compensator may be disposed in the data driver and turned on in the low frequency operation mode to compensate for a distortion in the folding area.

In an embodiment, the synthesized data output from the distortion compensator may be provided to the data driver, and the data driver may convert the synthesized data to the data signal and applies the data signal to the data line.

In an embodiment, the display device may further include an illuminance sensor which measures an ambient illuminance.

In an embodiment, the distortion compensator may further include an illuminance comparator which compares the ambient illuminance measured by the illuminance sensor with a predetermined reference value.

In an embodiment, the compensator may be turned off when the ambient illuminance is lower than a reference illuminance value, and the compensator may be turned on when the ambient illuminance is higher than the reference illuminance value.

In an embodiment, the reference illuminance value may be about 200 candela per square meter (cd/m2).

In an embodiment, the display panel may include a flexible display panel including an organic light emitting element.

In an embodiment, the folding information detector may include a first folding information detector which detects folding information about a first detection area of the folding area, and a second folding information detector which detects folding information about a second detection area of the folding area.

In an embodiment, the display device may further include an input sensing unit disposed on the display panel, a first strain sensor disposed in the input sensing unit and corresponding to the first detection area, and a second strain sensor disposed in the input sensing unit and corresponding to the second detection area.

In an embodiment, the first folding information detector may generate folding information about the first detection area based on a strain value measured by the first strain sensor, the second folding information detector may generate folding information about the second detection area based on a strain value measured by the second strain sensor, and the distortion compensator may perform compensations for the first and second detection areas, independently of each other.

An embodiment of the invention provides a display device including a display panel which displays an image, where the display panel includes a folding area folded with respect to an imaginary folding axis and a plurality of non-folding areas adjacent to the folding area when viewed in a plan view, an input sensing unit disposed on the display panel, where the input sensing unit includes a strain sensor which detects folding information of the display panel, a control module which outputs a control signal based on the folding information provided from the strain sensor, and a distortion compensator which compensates for a distortion of the image displayed through the folding area in response to the control signal.

According to embodiments set forth herein, when the flexural strain occurs in the folding area due to the folding operation, the distortion of the image displayed in the folding area may be compensated, and thus the display quality may be effectively prevented from being degraded due to the flexural strain of the folding area.

BRIEF DESCRIPTION OF THE DRAWINGS

The above and other features of the disclosure will become readily apparent by reference to the following detailed description when considered in conjunction with the accompanying drawings, in which.

DETAILED DESCRIPTION

Figure 1A:
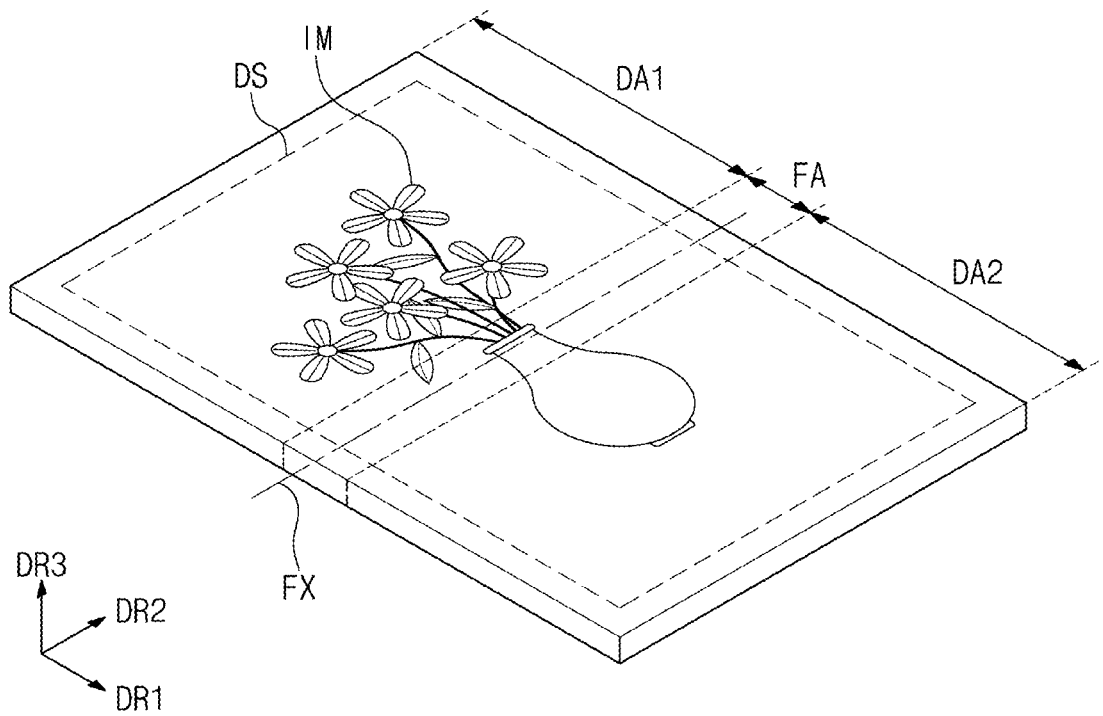
FIG. 1A is a perspective view showing a display device according to an exemplary embodiment of the disclosure.

The invention now will be described more fully hereinafter with reference to the accompanying drawings, in which various embodiments are shown. The invention may, however, be embodied in many different forms, and should not be construed as limited to the embodiments set forth herein. Rather, these embodiments are provided so that this disclosure will be thorough and complete, and will fully convey the scopes of the invention to those skilled in the art.

In the disclosure, it will be understood that when an element or layer is referred to as being "on", "connected to" or "coupled to" another element or layer, it can be directly on, connected or coupled to the other element or layer or intervening elements or layers may be present. In contrast, the term "directly on", "directly connected to" or "directly coupled to" means that there are no intervening elements.

Like numerals refer to like elements throughout. In the drawings, the thickness, ratio, and dimension of components are exaggerated for effective description of the technical content.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be further understood that the terms "comprises" and/or "comprising," or "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Hereinafter, exemplary embodiments of the disclosure will be described in detail with reference to the accompanying drawings.

Figure 1B:
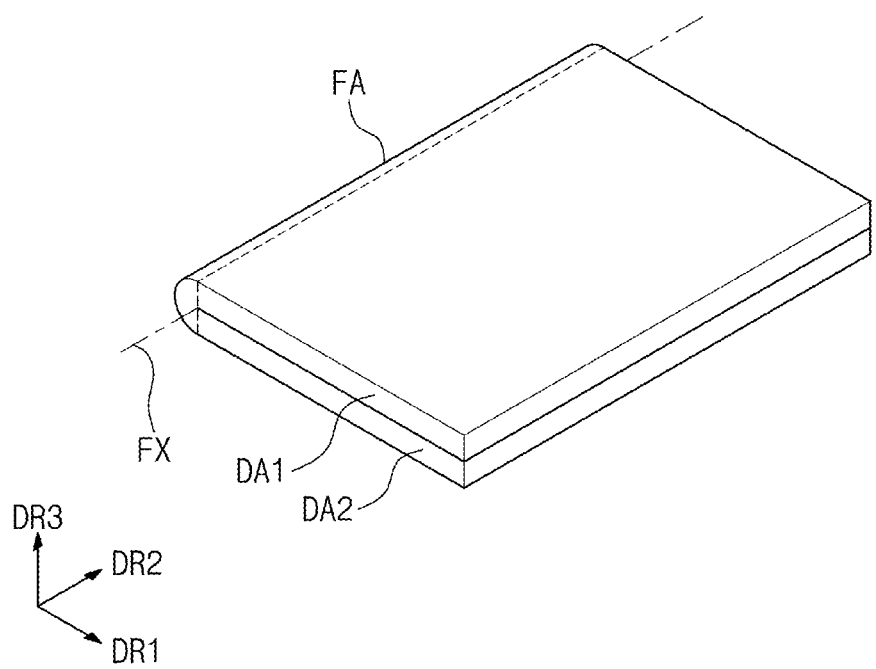
FIG. 1B is a perspective view showing a display device in an in-folding state according to an exemplary embodiment of the disclosure.

FIG. 1A is a perspective view showing a display device according to an exemplary embodiment of the disclosure. FIG. 1B is a perspective view showing a display device in an in-folding state according to an exemplary embodiment of the disclosure, and FIG. 1C is a perspective view showing a display device in an out-folding state according to an exemplary embodiment of the disclosure.

Figure 1C:
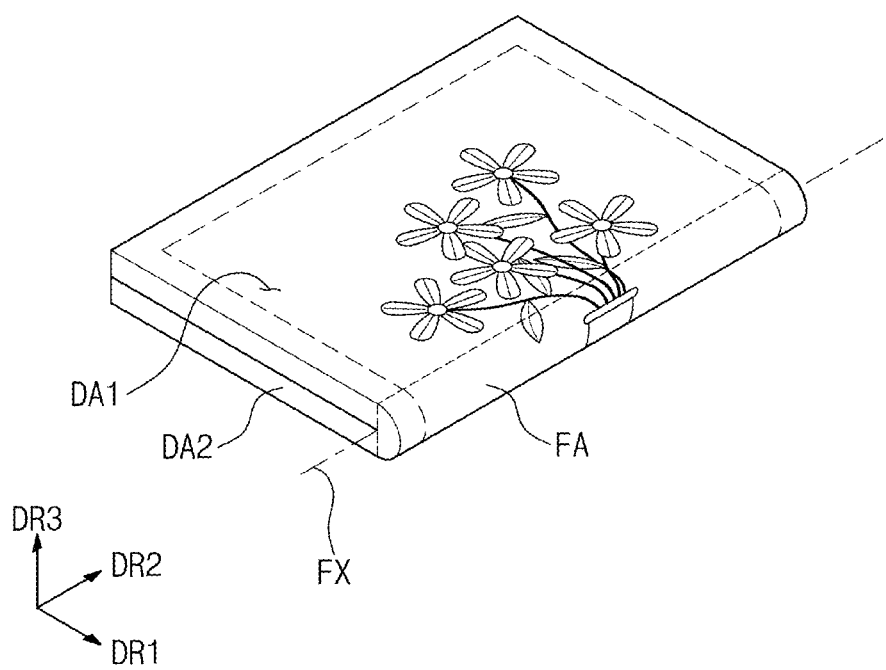
FIG. 1C is a perspective view showing a display device in an out-folding state according to an exemplary embodiment of the disclosure.

Referring to FIGS. 1A to 1C, an exemplary embodiment of the display device includes a first display area DA1, a second display area DA2, and a folding area FA. FIGS. 1A to 1C show one exemplary embodiment of the display device, but not being limited thereto. Alternatively, the display device may include two or more folding areas.

The folding area FA is disposed between the first display area DA1 and the second display area DA2. A folding axis FX is defined in the folding area FA. The folding axis FX is a rotational axis when the display device is folded, and the folding axis may be defined by a mechanism structure of the display device.

The display device includes a display surface DS through which an image IM is displayed. The display surface DS may be divided into a display surface of the first display area DA1, a display surface of the second display area DA2, and a display surface of the folding area FA. Hereinafter, for convenience of description, exemplary embodiments where a first direction DR1 and a second direction DR2 define the display surface DS in an unfolded state will be described in detail. A third direction DR3 indicates a thickness direction of the display device. In addition, the second direction DR2 indicates an extension direction of the folding axis FX.

In an exemplary embodiment, as shown in FIGS. 1B, the display device may be folded along the folding axis FX such that the display surface of the first display area DA1 and the display surface of the second display area DA2 face each other. Herein, a folded state in which the display surfaces of different display areas from each other face each other is referred to as an "in-folding". In an exemplary embodiment, as the first display area DA1 is rotated in a clockwise direction with respect to the folding axis FX, the display device may be in-folded. The folding axis FX may be defined at a center of the display device in the first direction DR1 to allow the display device to be in-folded, and thus the first display area DA1 and the second display area DA2 are aligned with each other.

In an exemplary embodiment, as shown in FIG. 1C, the display device may be folded along the folding axis FX to allow the display surface of the first display area DA1 and the display surface of the second display area DA2 to face an outside of the display device. Herein, a folded state in which the display surfaces of different display areas from each other face the outside is referred to as an "out-folding".

In an exemplary embodiment, as shown in FIGS. 1A to 1C, the display device displays the image IM when the display surface of the first display area DA1 and the display surface of the second display area DA2 are exposed to the outside. In such an embodiment, the image IM may be displayed through the display surface of the folding area FA exposed to the outside. In an exemplary embodiment, as shown in FIG. 1A, the image IM may be displayed when the display device is in the unfolded state. The first display area DA1, the second display area DA2, and the folding area FA may respectively display images to provide information independently of each other or may respectively display portions of a single image corresponding one image information.

Figure 2A:
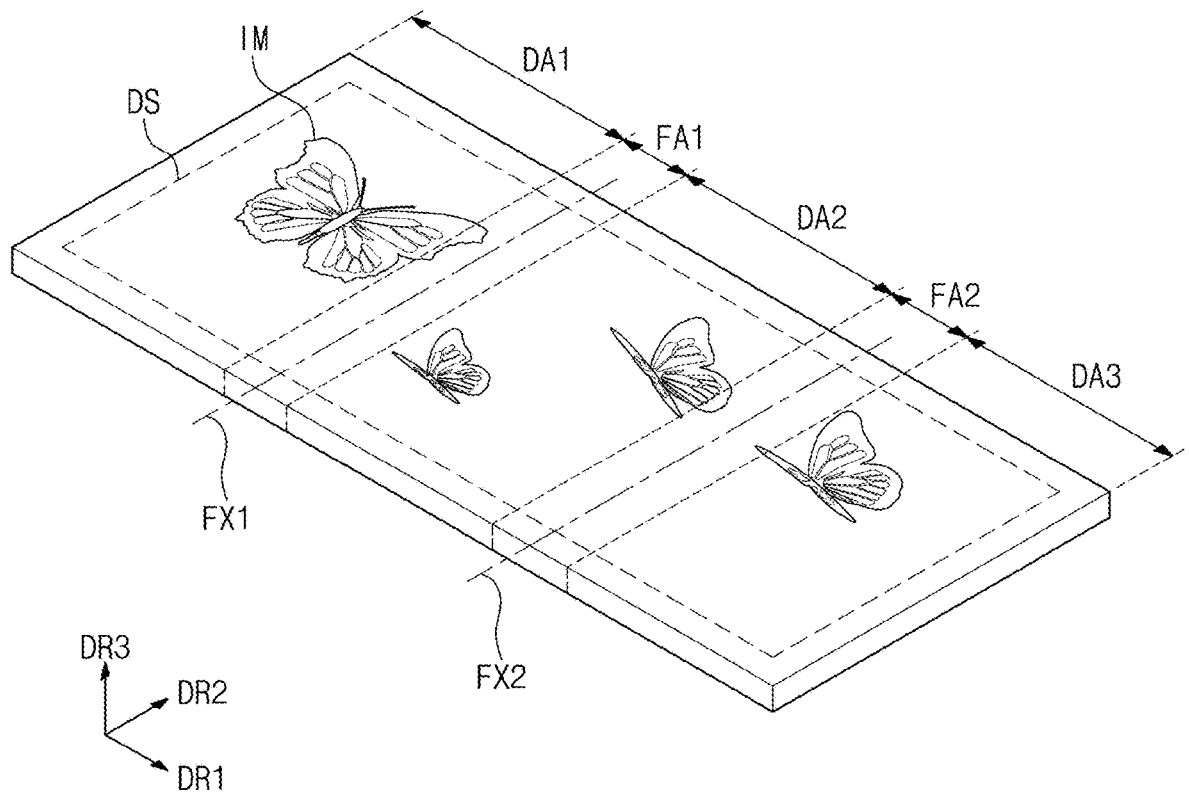
FIG. 2A is a perspective view showing a display device according to an exemplary embodiment of the disclosure.
Figure 2B:
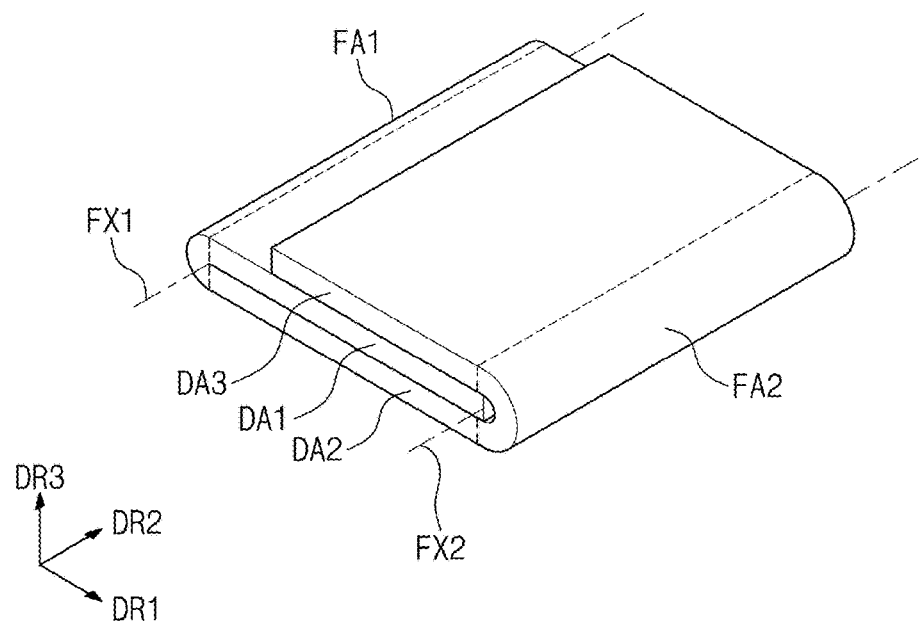
FIG. 2B is a perspective view showing a display device in a folded state according to an exemplary embodiment of the disclosure.
Figure 2C:
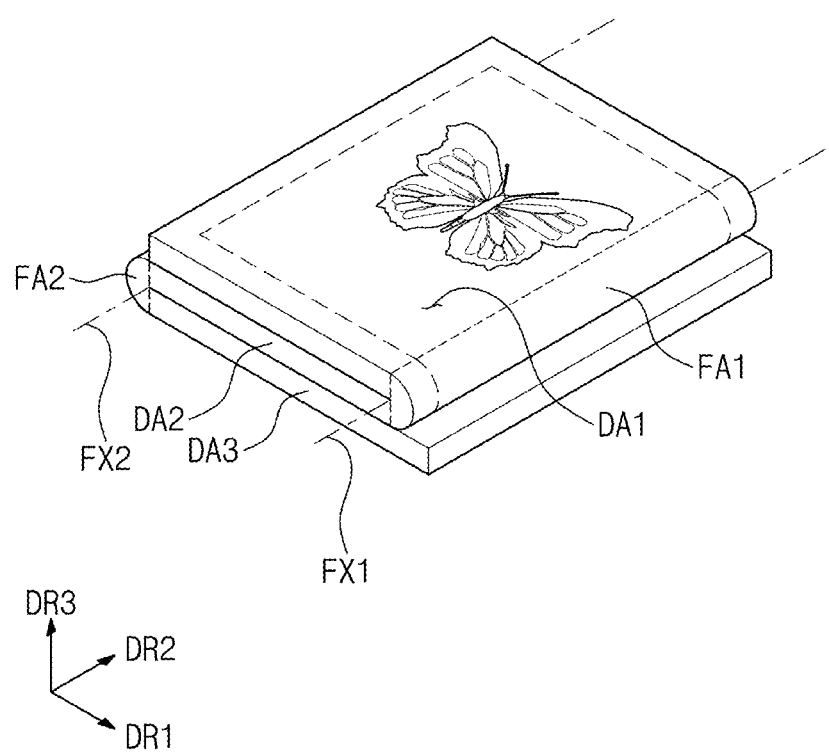
FIG. 2C is a perspective view showing a display device in a folded state according to an exemplary embodiment of the disclosure.

FIG. 2A is a perspective view showing a display device according to an exemplary embodiment of the disclosure. FIG. 2B is a perspective view showing a display device in a folded state according to an exemplary embodiment of the disclosure, and FIG. 2C is a perspective view showing a display device in a folded state according to an exemplary embodiment of the disclosure.

Referring to FIGS. 2A and 2B, an exemplary embodiment of the display device may include a plurality of folding areas FA1 and FA2. In an exemplary embodiment, as shown in FIGS. 2A and 2B, the display device includes two folding areas, for example.

In such an embodiment, the display device includes first, second, and third display areas DA1, DA2, and DA3 and the first and second folding areas FA1 and FA2. When the display device is in the unfolded state, the first folding area FA1 is disposed between the first display area DA1 and the second display area DA2, and the second folding area FA2 is disposed between the second display area DA2 and the third display area DA3. The first and second folding areas FA1 and FA2 may have different widths from each other.

A first folding axis FX1 and a second folding axis FX2 may be defined in the first and second folding areas FA1 and FA2, respectively. The display device may be in-folded or out-folded along the first folding axis FX1 and the second folding axis FX2.

In an exemplary embodiment as shown in FIG. 2B, the display device may be in-folded along the first folding axis FX1 in the first folding area FA1 and may be in-folded along the second folding axis FX2 in the second folding area FA2. In such an embodiment, as shown in FIGS. 2A and 2B, the display device may display the image IM when a display surface of the first display area DA1, a display surface of the second display area DA2, and a display surface of the third display area DA3 are exposed to the outside. In such an embodiment, the image IM may be displayed through a display surface of the first folding area FA1 and a display surface of the second folding area FA2, which are exposed to the outside.

In an exemplary embodiment, as shown in FIG. 2C, the display device may be out-folded along the first folding axis FX1 in the first folding area FA1 and may be in-folded along the second folding axis FX2 in the second folding area FA2. The display device may be out-folded in the first folding area FA1 such that the display surface of the first display area DA1 is exposed to the outside and may be in-folded in the second folding area FA2 such that the display surface of the second display area DA2 and the display surface of the third display area DA3 face each other. In such an embodiment, the display device in a folded state may display the image IM to the outside through the first display area DA1. The display device in the unfolded state may display the image IM through the display surfaces of the first to third display areas DA1 to DA3 and the display surfaces of the first and second folding areas FA1 and FA2.

Figure 3A:
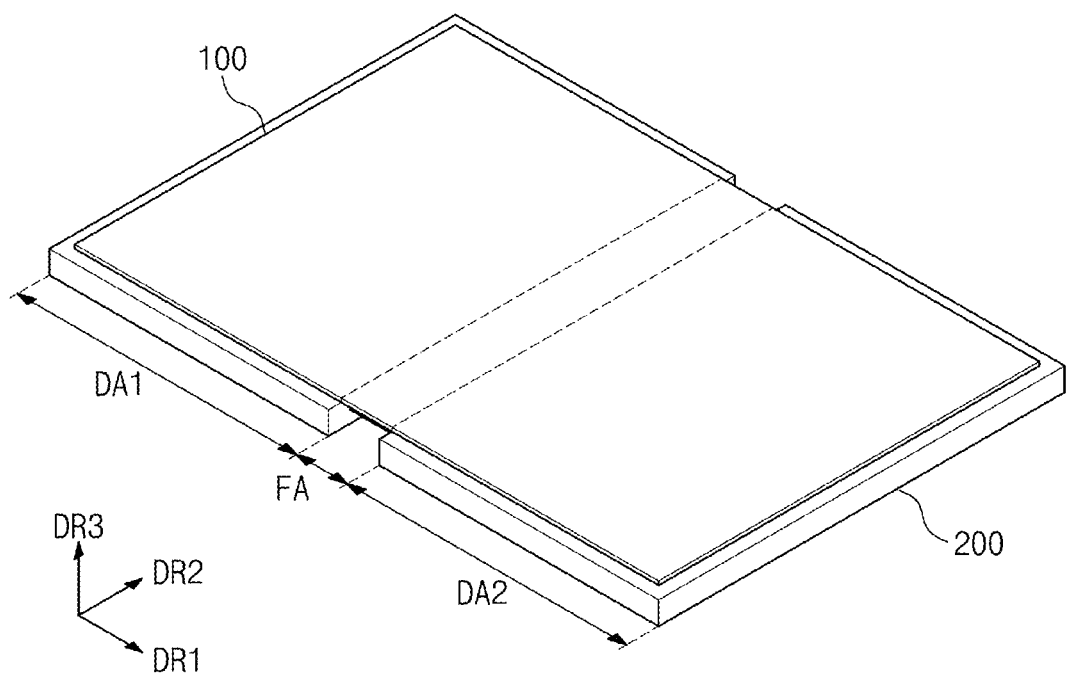
FIG. 3A is a perspective view showing a display device according to an exemplary embodiment of the disclosure.
Figure 3B:
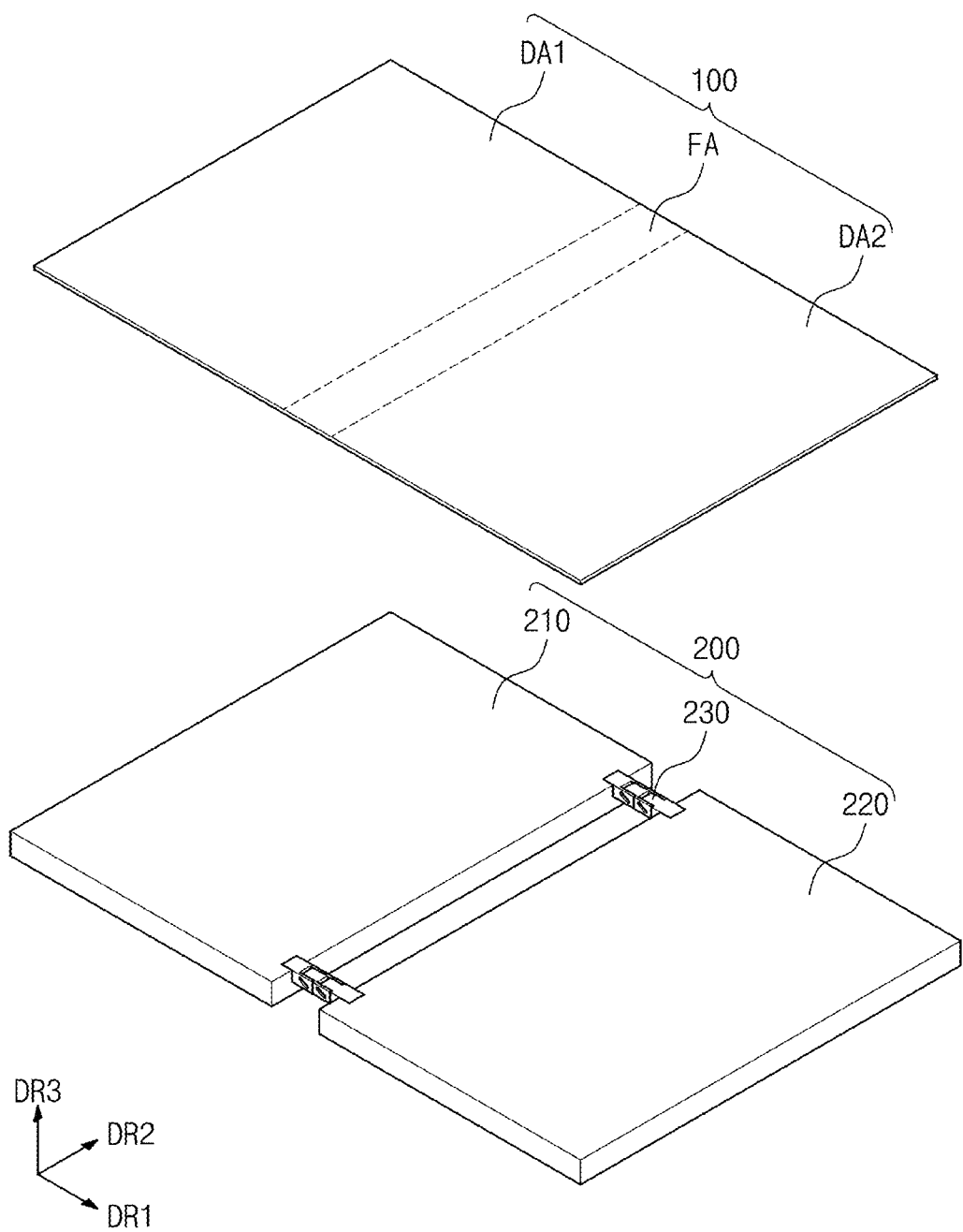
FIG. 3B is an exploded perspective view showing a display device according to an exemplary embodiment of the disclosure.

FIG. 3A is a perspective view showing a display device according to an exemplary embodiment of the disclosure. FIG. 3B is an exploded perspective view showing a display device according to an exemplary embodiment of the disclosure.

The display device shown in FIGS. 3A and 3B may correspond to the exemplary embodiment of the display device described above with reference to FIGS. 1A and 1B. In an exemplary embodiment described above with reference to FIGS. 2A and 2B, a hinge module 230 described below may be provided in the first folding area FA1 and the second folding area FA2.

An exemplary embodiment of the display device may include a display module 100 and a housing 200. The display module 100 may be, but not limited to, a flexible display module having a flexibility. In an exemplary embodiment, an entire portion of the display module 100 may have flexibility, or only a portion of the display module 100 (for example, a portion corresponding to the folding area FA) may have flexibility. The display module 100 may include the first display area DA1, the second display area DA2, and the folding area FA, as described above with reference to FIGS. 1A and 1B.

The display module 100 is partially or entirely coupled to the housing 200. The coupling structure between the display module 100 and the housing 200 is not particularly limited. In one exemplary embodiment, for example, the housing 200 may provide a flat surface on which the display module 100 is disposed. In an exemplary embodiment of the disclosure, the housing 200 may define a predetermined space, and the display module 100 may be accommodated in the predetermined space. In one exemplary embodiment, for example, the housing 200 may define a stepped space, and the display module 100 may be disposed in the stepped space.

The display module 100 may be entirely rolled or may be folded in a predetermined area thereof. The display module 100 may include a flexible display panel and may further include various functional members. The display panel may be an organic light emitting display panel, an electrophoretic display panel, or an electrowetting display panel. The functional members may include a protective member, an optical member, and a touch panel.

The housing 200 includes a plurality of portions coupled to each other. The housing 200 may include a first support module 210, a second support module 220 disposed to be spaced apart from the first support module 210, and the hinge module 230 connecting the first support module 210 and the second support module 220 to each other. The number of the support modules included in the housing 200 corresponds to the number of the display areas DA1 and DA2 of the display module 100.

The first support module 210 and the second support module 220 may respectively support the first display area DA1 and the second display area DA2 and may be respectively coupled to the first display area DA1 and the second display area DA2. Each of the first support module 210 and the second support module 220 may include a plurality of portions coupled to each other or may have an integral shape integrally formed as a single unitary unit by injection molding/extrusion molding.

In an exemplary embodiment, as shown in FIG. 3B, two hinge modules 230 may be spaced apart from each other in the second direction DR2. In exemplary embodiments, the number of the hinge modules 230 is not particularly limited.

Each of the two hinge modules 230 is disposed to correspond to the folding area FA of the display module 100 and connects the first support module 210 and the second support module 220. An end of each of the two hinge modules 230 is coupled to the first support module 210, and another end of each of the two hinge modules 230 is coupled to the second support module 220.

The disclosure is not limited to the housing 200 shown in FIGS. 3A and 3B, and the housing 200 may be variously modified to have an structure.

Figure 4A:
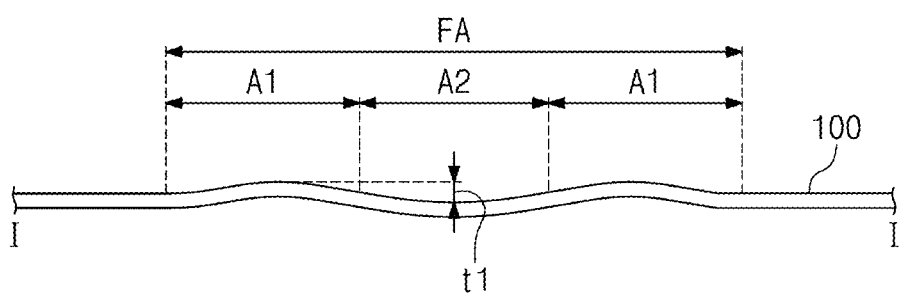
FIGS. 4A and 4B are views showing a flexural strain of a folding area according to an exemplary embodiment of the disclosure.
Figure 4B:
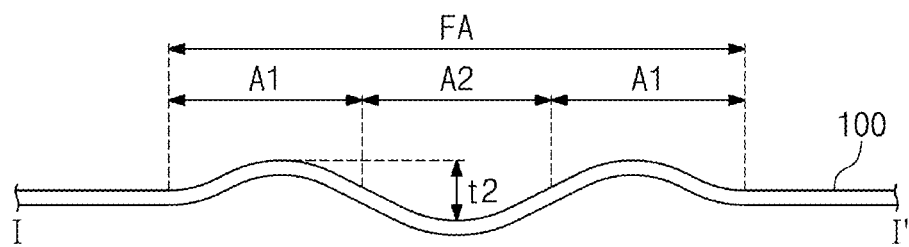
Figure 5A:
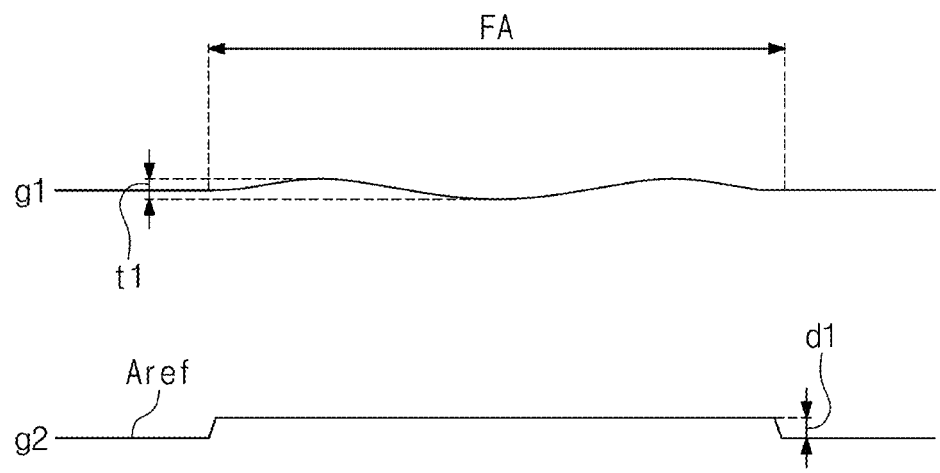
FIG. 5A is a graph showing luminance characteristics according to the flexural strain of the display device shown in FIG. 4A.
Figure 5B:
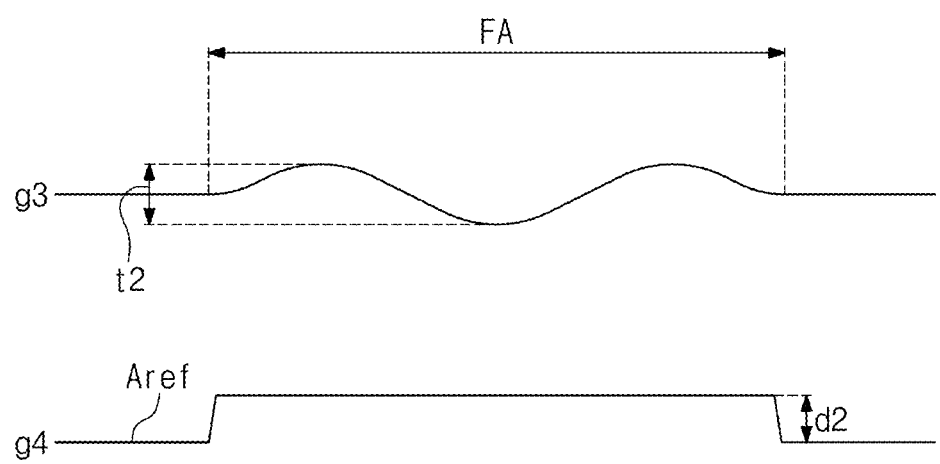
FIG. 5B is a graph showing luminance characteristics according to the flexural strain of the display device shown in FIG. 4B.
Figures 6, 7:
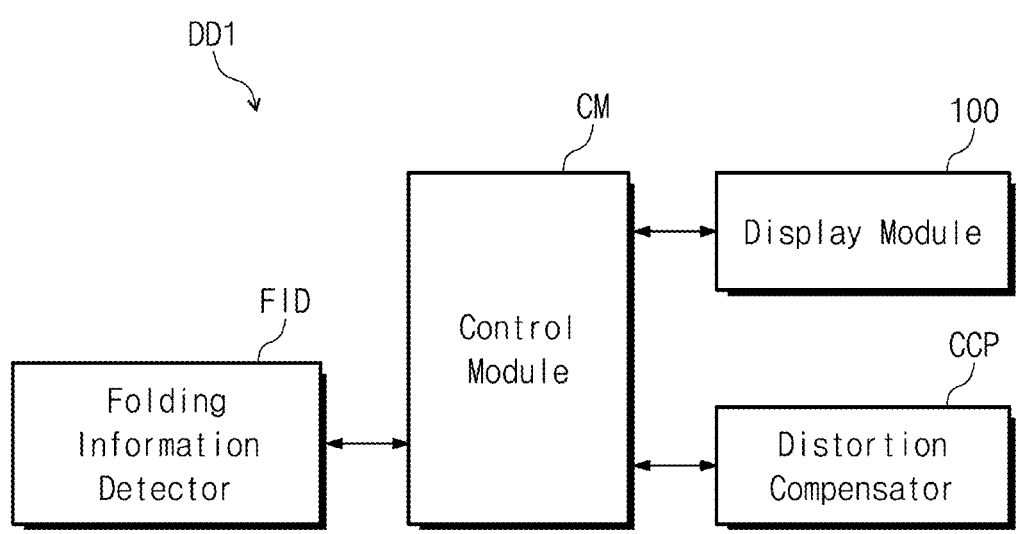
FIG. 6 is a table showing a strain amount as a function of a cumulative folding count and a cumulative folding time.
FIG. 7 is a block diagram showing a display device according to an exemplary embodiment of the disclosure.

FIGS. 4A and 4B are views showing a flexural strain of a folding area according to an exemplary embodiment of the disclosure. FIG. 5A is a graph showing luminance characteristics according to the flexural strain of the display device shown in FIG. 4A, and FIG. 5B is a graph showing luminance characteristics according to the flexural strain of the display device shown in FIG. 4B. FIG. 6 is a table showing a strain amount as a function of a cumulative folding count and a cumulative folding time.

Referring to FIGS. 4A and 4B, in an exemplary embodiment, fatigue may be accumulated in a portion of the display module 100 overlapping the folding area FA due to repetitive folding and unfolding operations of the display device. Accordingly, a shape of the display module 100 may be deformed in the folding area FA. The shape deformation includes the flexural strain, such as sagging shape or lumped shape in the folding area FA of the display module 100.

In particular, a flexural strain rate in the folding area FA may vary depending on the cumulative folding count and the cumulative folding time of the display device. That is, as the cumulative folding count increases and as the cumulative folding time increases, the flexural strain rate increases.

In FIGS. 4A to 5B, the flexural strain rate is represented as a difference in height of the display module 100 in the folding area FA.

Referring to FIGS. 4A and 4B, the display module 100 in which the flexural strain occurs may include a first area A1 having a convexly lumped shape in the folding area FA and a second area A2 having a concavely sagging shape in the folding area FA. FIG. 4A shows a structure in which two first areas A1 and one second area A2 are defined in the folding area FA, but not being limited thereto or thereby. That is, each of the first and second areas A1 and A2 may be provided in plural in the folding area FA.

In an exemplary embodiment as shown in FIG. 4A, the display module 100 may have a first flexural strain rate t1. The first flexural strain rate t1 is defined as a height difference between the first area A1 and the second area A2. In an exemplary embodiment, as shown in FIG. 4B, the display module 100 may have a second flexural strain rate t2. The second flexural strain rate t2 is defined as the height difference between the first area A1 and the second area A2. In such embodiments, the second flexural strain rate t2 may be greater than the first flexural strain rate t1. That is, the display module 100 show in FIG. 4B may be a display module having a larger cumulative folding count or a longer cumulative folding time than those of the display module 100 shown in FIG. 4A.

As shown in FIG. 6, as the cumulative folding count increases from n times to 7n times, the flexural strain rate increases from about 40.1 micrometers (μm) to about 40.7 μm. In addition, as the cumulative folding time increases from k time to 4k time at the same cumulative folding count, the flexural strain rate has increased by approximately 0.3 μm. That is, as the cumulative folding count and the cumulative folding time increase, the flexural strain rate increases. Herein, n and k are natural numbers.

FIG. 6 shows only the cumulative folding count and the cumulative folding time as variables that affect the flexural strain, but such variables may not be limited thereto or thereby. The variables affecting the flexural strain may further include a folding angle, a position of the folding area FA, and a length of the folding area FA, for example.

Referring to FIGS. 5A and 5B, when the flexural strain occurs in the folding area FA of the display module 100, the luminance of the folding area FA may increase. The increase in luminance of the folding area FA due to the flexural strain may vary depending on the flexural strain rate. That is, a first graph g1 of FIG. 5A corresponds to a strain rate curve of the display module 100, and a second graph g2 of FIG. 5A corresponds to a luminance curve of the display module 100. When the folding area FA of the display module 100 has the first flexural strain rate t1, the luminance of the folding area FA has increased by a first value d1 as compared with a reference luminance value Aref.

In FIG. 5B, a third graph g3 corresponds to a strain rate curve of the display module 100, and a fourth graph g4 corresponds to a luminance curve of the display module 100. When the folding area FA of the display module 100 has the second flexural strain rate t2, the luminance of the folding area FA has increased by a second value d2 as compared with the reference luminance value Aref. In this case, the second flexural strain rate t2 may be greater than the first flexural strain rate t1, and the second value d2 may be greater than the first value d1.

In addition, the visibility of the luminance difference in the folding area FA at the same flexural strain rate may vary depending on an ambient illuminance. That is, when the ambient illuminance is high, a change in luminance may be perceived more easily than when the ambient illuminance is low.

In a case where the image is displayed through the display device in the unfolded state and the flexural strain occurs in the folding area FA, a reflectivity of an external light may increase in the first area A1 due to the convexly lumped shape. Therefore, the reflection of external light may cause undesired phenomenon such as high luminance or glare phenomenon in the folding area FA.

As a result, the luminance difference may occur between the folding area FA and the first and second display areas DA1 and DA2 (i.e., a non-folding area). That is, the folding area FA may have a higher luminance than the non-folding area at a same grayscale level, and the luminance difference may affect the display quality of the display device.

Figure 8:
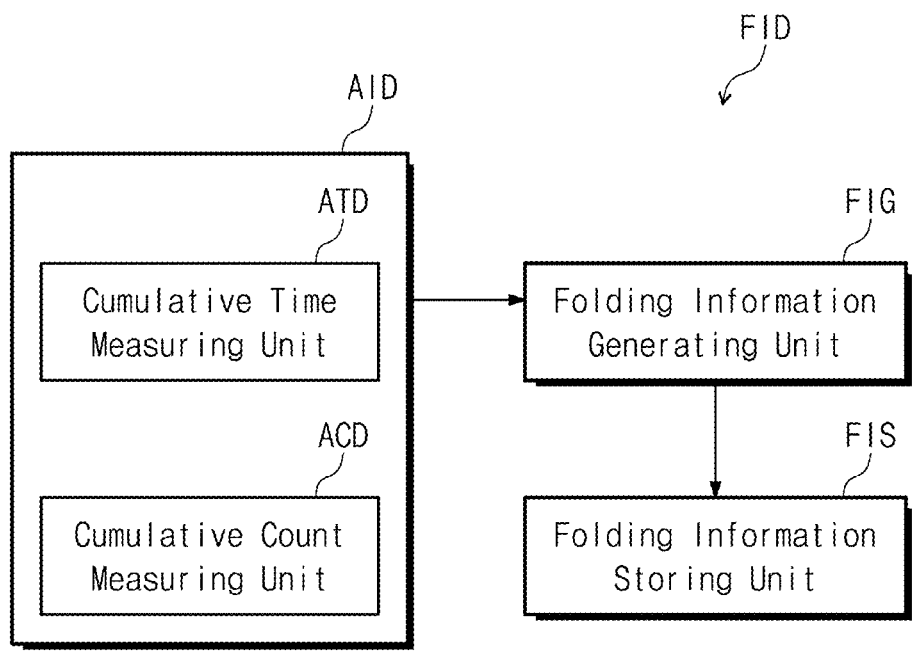
FIG. 8 is a block diagram showing a folding information detector shown in FIG. 7.
Figure 9:
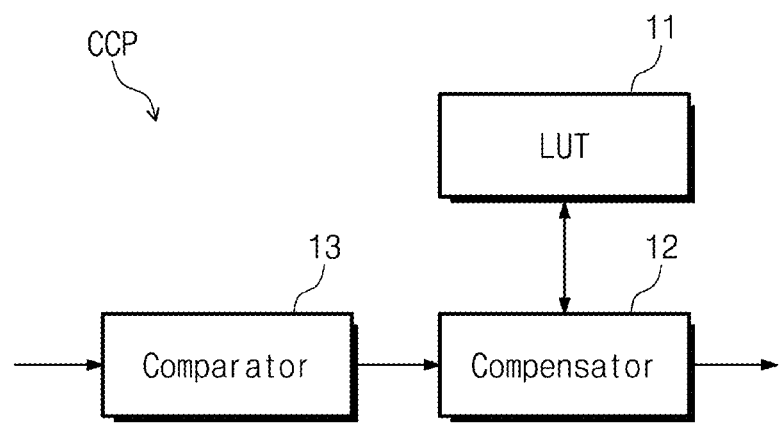
FIG. 9 is a block diagram showing a distortion compensator shown in FIG. 7.

FIG. 7 is a block diagram showing a display device according to an exemplary embodiment of the disclosure, and FIG. 8 is a block diagram showing a folding information detector shown in FIG. 7. FIG. 9 is a block diagram showing a distortion compensator shown in FIG. 7.

Referring to FIG. 7, an exemplary embodiment of a display device DD1 includes a display module 100, a control module CM, the folding information detector FID, and the distortion compensator CCP.

The control module CM controls an overall operation of the display device DD1. The control module CM may be, but not limited to, a microprocessor. In one exemplary embodiment, for example, the control module CM activates or deactivates the display module 100. The control module CM may control other modules based on a touch signal applied thereto from the display module 100.

The control module CM may output a control signal to control an operation of the distortion compensator CCP based on folding information of the display device DD1, which are provided from the folding information detector FID.

Although not shown in figures, the display device DD1 may further include a power supply, a wireless communication module, an image input module, a sound input module, a memory, or an external interface, which are connected to the control module CM.

Referring to FIGS. 7 and 8, the folding information detector FID detects the folding information based on the folded state of the display device DD1. The folding information detected by the folding information detector FID may be used to control the distortion compensator CCP through the control module CM.

In an exemplary embodiment, as shown in FIG. 8, the folding information detector FID may include a measuring unit AID, a folding information generating unit FIG, and a folding information storing unit FIS.

The measuring unit AID may measure cumulative information with respect to the folding operation of the display device DD1. In such an embodiment, the measuring unit AID may determine whether the display device DD1 is in the folded state and/or the unfolded state. In an exemplary embodiment, the measuring unit AID may include a cumulative time measuring unit ATD and a cumulative count measuring unit ACD.

The cumulative time measuring unit ATD measures the cumulative folding time of the display device DD1, and the cumulative count measuring unit ACD measures the cumulative folding count of the display device DD1.

The folding information generating unit FIG may generate the folding information based on the cumulative information. The folding information generating unit FIG may further include a lookup table ("LUT") in which a predetermined strain amount corresponding to the folding time and folding count is stored. The folding information generating unit FIG reads out a corresponding strain amount from the LUT based on the cumulative folding time and the cumulative folding count and outputs the read-out strain amount as the folding information.

The folding information storing unit FIS stores the folding information output from the folding information generating unit FIG. The folding information stored in the folding information storing unit FIS may be provided to the control module CM. The folding information may be provided to the control module by a user's request or may be periodically provided to the control module CM at every predetermined time interval.

Referring to FIGS. 7 and 9, the distortion compensator CCP receives the folding information in response to the control signal and compensates for a distortion of the image displayed through the folding area FA (refer to FIG. 1A). In an exemplary embodiment, the distortion compensator CCP may include an LUT 11, a compensator 12, and a comparator 13. Compensation data corresponding to the folding information may be stored in the LUT 11. The compensator 12 may receive image data, may receive the compensation data from the LUT 11, and may output synthesized data obtained by synthesizing the compensation data and the image data.

The comparator 13 may compare the folding information with a predetermined reference value. When the folding information is less than the predetermined reference value, the compensator 12 is turned off, and when the folding information is greater than the predetermined reference value, the compensator 12 is turned on. When the compensator 12 is turned off, an operation that compensates for the image data is not carried out, and when the compensator 12 is turned on, an operation that synthesizes the compensation data and the image data to compensate for the image data is carried out.

Figure 10:
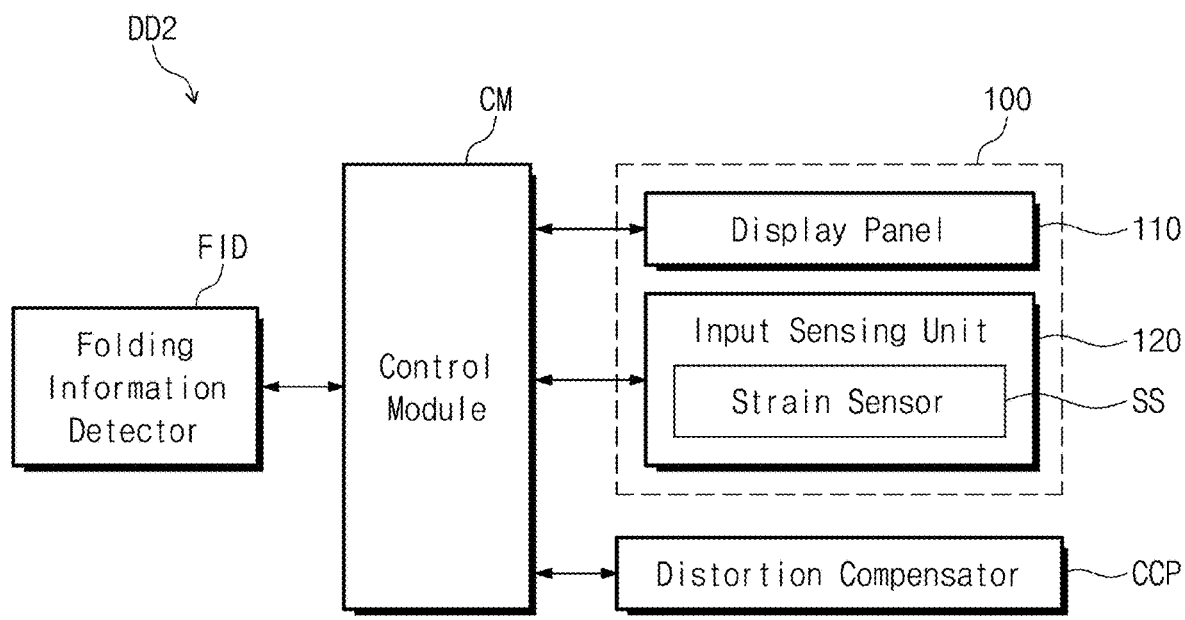
FIG. 10 is a block diagram showing a display device according to an exemplary embodiment of the disclosure.
Figure 11:
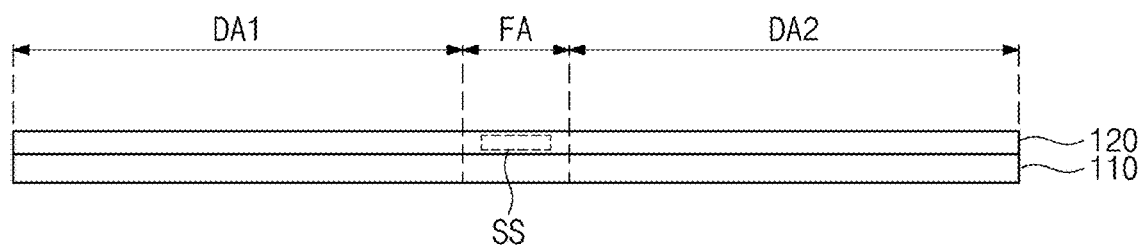
FIG. 11 is a cross-sectional view showing a display module shown in FIG. 10.

FIG. 10 is a block diagram showing a display device DD2 according to an exemplary embodiment of the disclosure, and FIG. 11 is a cross-sectional view showing a display module 100 shown in FIG. 10.

Referring to FIG. 10, an exemplary embodiment of the display module 100 of the display device DD2 may include a display panel 110 and an input sensing unit 120.

The display panel 110 may have a configuration to generate an image. The image generated by the display panel 110 is displayed on a front surface of the display module 100 and perceived by a user. In an exemplary embodiment, the display panel 110 may be a light emitting type display panel, but not being particularly limited. In one alternative embodiment, for example, the display panel 110 may be an organic light emitting display panel or a quantum dot light emitting display panel. A light emitting layer of the organic light emitting display panel may include an organic light emitting material. A light emitting layer of the quantum dot light emitting display panel may include a quantum dot and a quantum rod. Hereinafter, for convenience of description, exemplary embodiments where the display panel 110 is the organic light emitting display panel will be described in detail.

The input sensing unit 120 senses an external input applied thereto from the outside. In one exemplary embodiment, for example, the input sensing unit 120 may sense the external input by the user. The external input includes various inputs, such as a touch by a portion of user's body, light, heat, a pen, or pressure.

Referring to FIGS. 10 and 11, the input sensing unit 120 may be disposed on the display panel 110. In an exemplary embodiment, the input sensing unit 120 is formed by a continuous process after forming the display panel 110. In such an embodiment, the input sensing unit 120 may be referred to as an "input sensing layer".

In an exemplary embodiment, the input sensing unit 120 may be fixed onto the display panel 110 by an adhesive layer. In such an embodiment, the input sensing unit 120 may be referred to as an "input sensing panel". A functional layer may further be disposed between the input sensing panel or the input sensing layer and the display panel 110. The functional layer may include an anti-reflective layer having an anti-reflective function.

The input sensing layer and the input sensing panel will be described later in greater detail.

In an exemplary embodiment, the display device DD2 may further include a strain sensor SS disposed in the input sensing unit 120. In such an embodiment, the strain sensor SS may be disposed in the input sensing unit 120 corresponding to the folding area FA.

The strain sensor SS may determine whether the display device DD2 is in the folded state and/or the unfolded state. The operation of determining the folded state by the strain sensor SS may be carried out based on a strain value of the folding area FA in which the display device DD2 is folded. The strain value measured by the strain sensor SS may be provided to the folding information detector FID. The folding information detector FID may determine whether the display device DD is in the folded state or in the unfolded state based on the strain value output from the strain sensor SS.

In an exemplary embodiment, as shown in FIGS. 8 and 10, the cumulative time measuring unit ATD counts the folding time during which the display device DD2 is in the folded state based on the strain value output from the strain sensor SS to calculate the cumulative folding time. In such an embodiment, the cumulative count measuring unit ACD counts the folding count based on a variation in the strain value output from the strain sensor SS to calculate the cumulative folding count.

Figure 12:
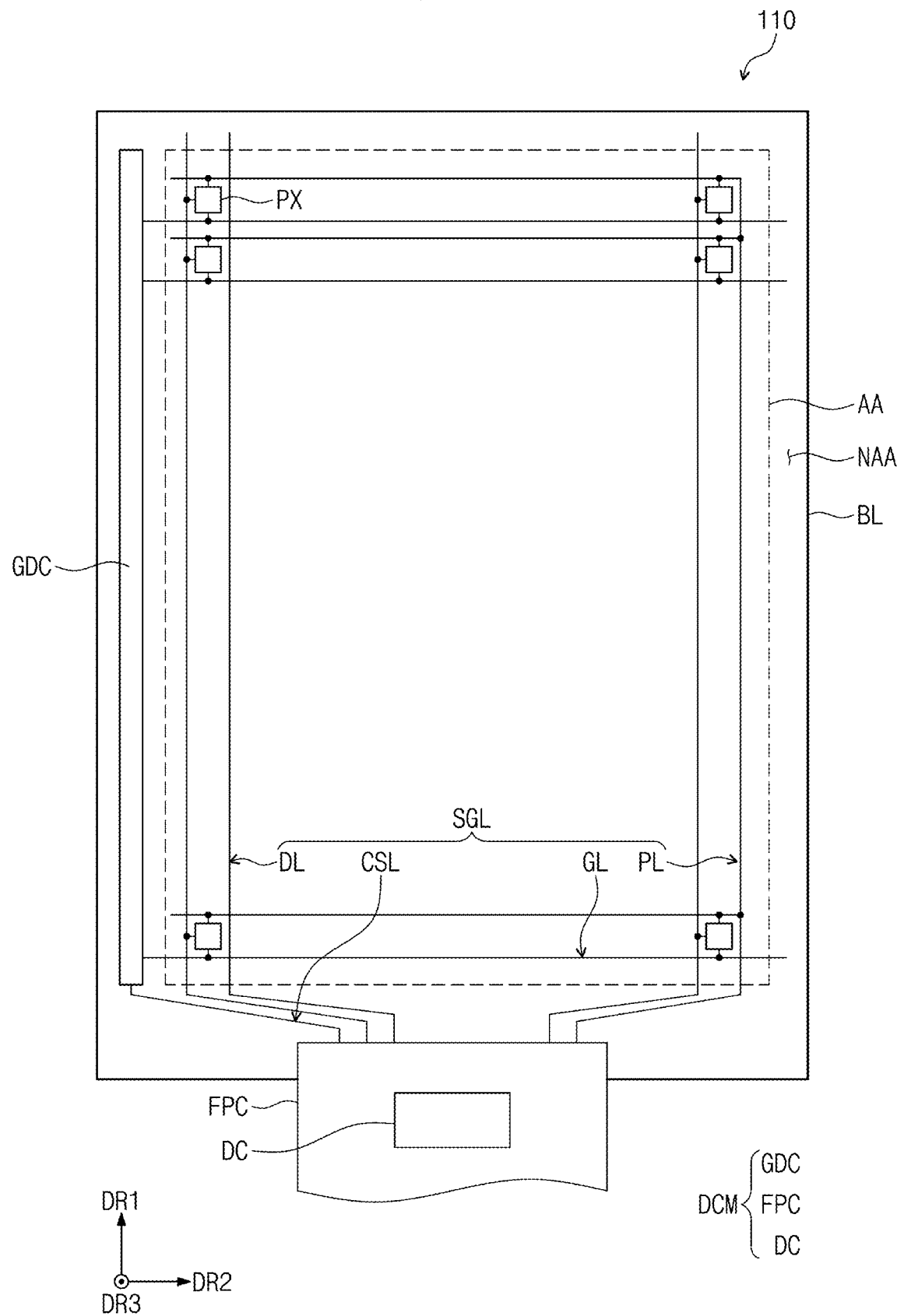
FIG. 12 is a plan view showing a display panel shown in FIG. 11.
Figure 13A:
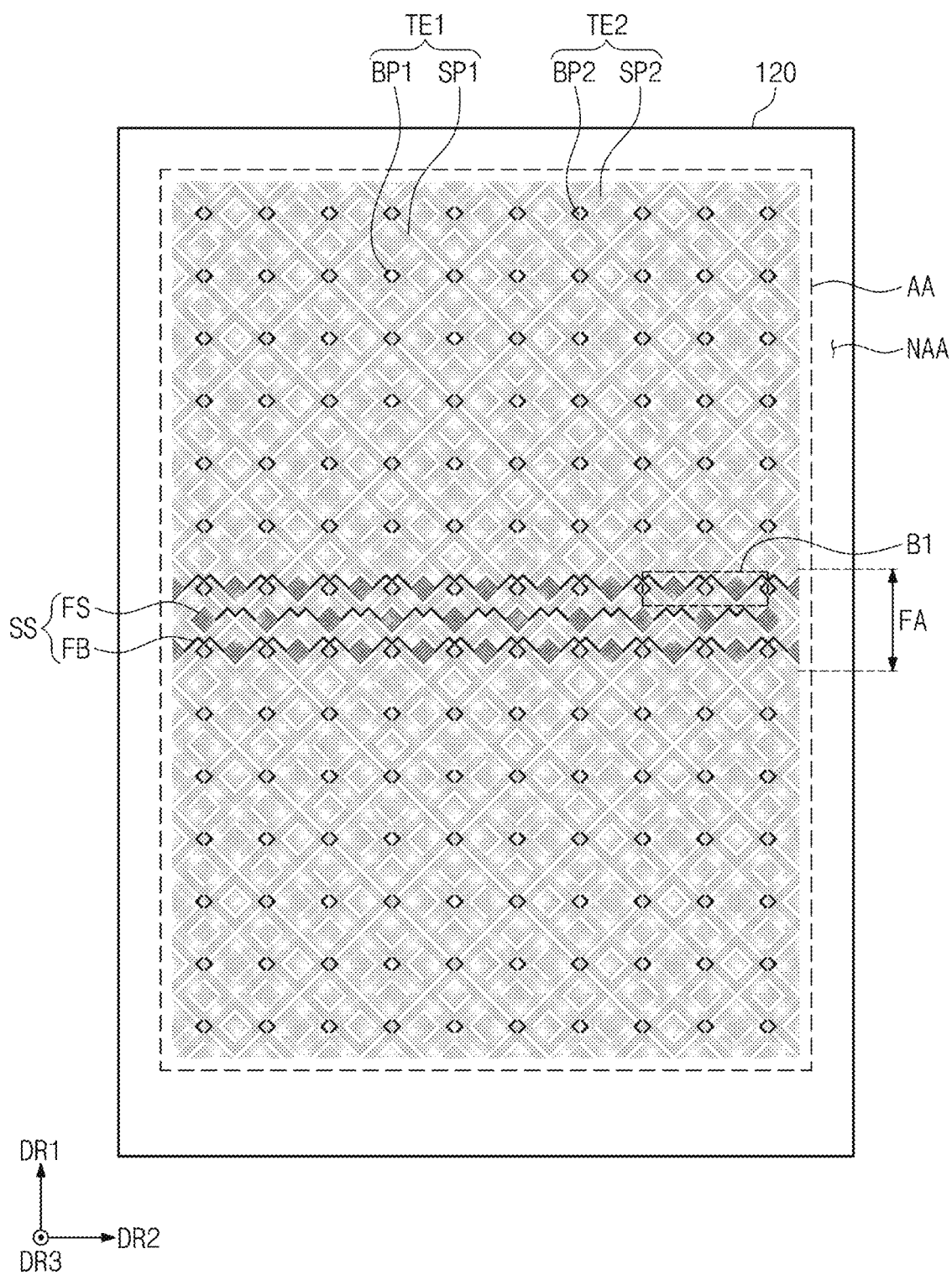
FIG. 13A is a plan view showing an input sensing unit shown in FIG. 11.
Figure 13B:
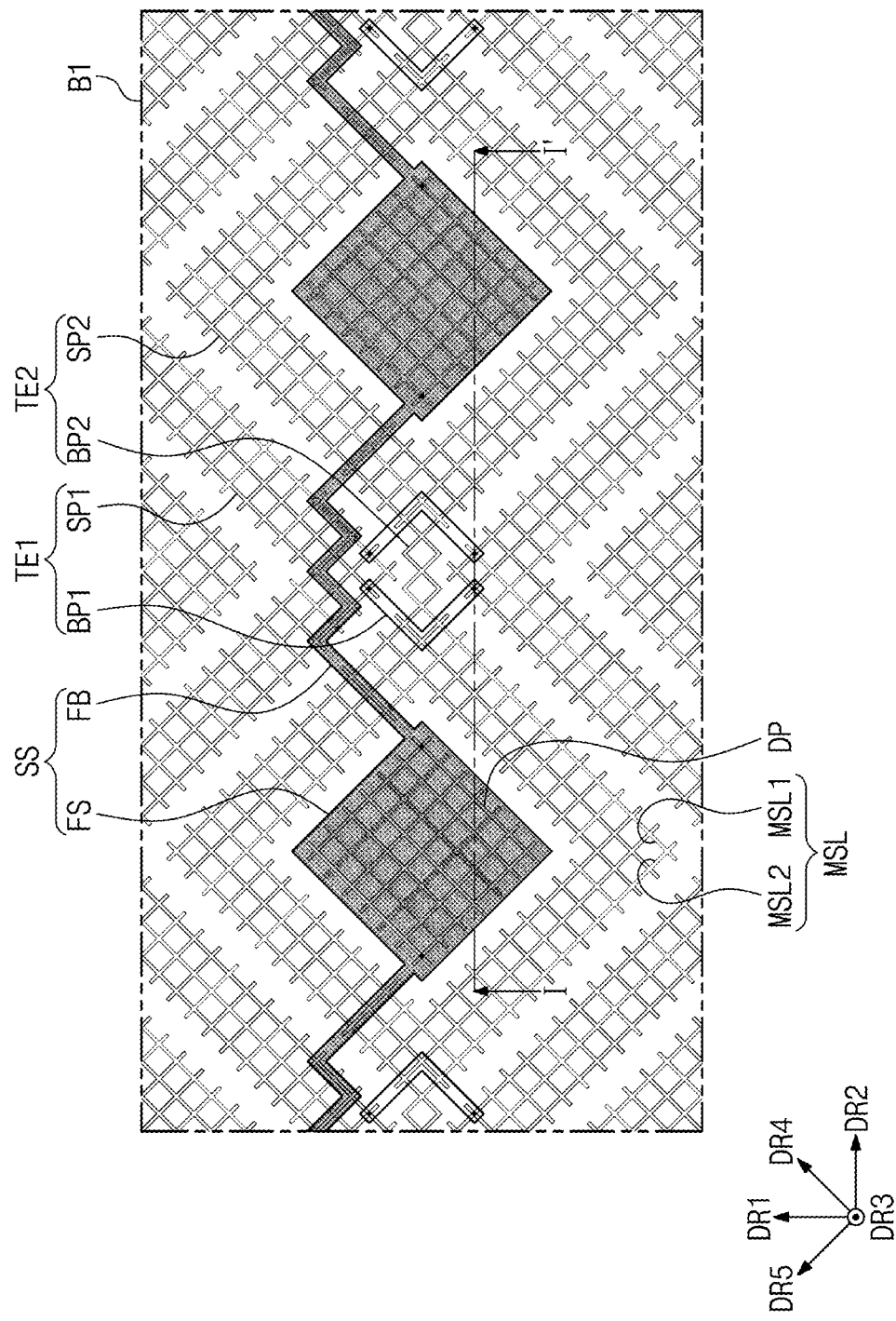
FIG. 13B is a partially enlarged view of a portion B1 shown in FIG. 13A.
Figure 13C:
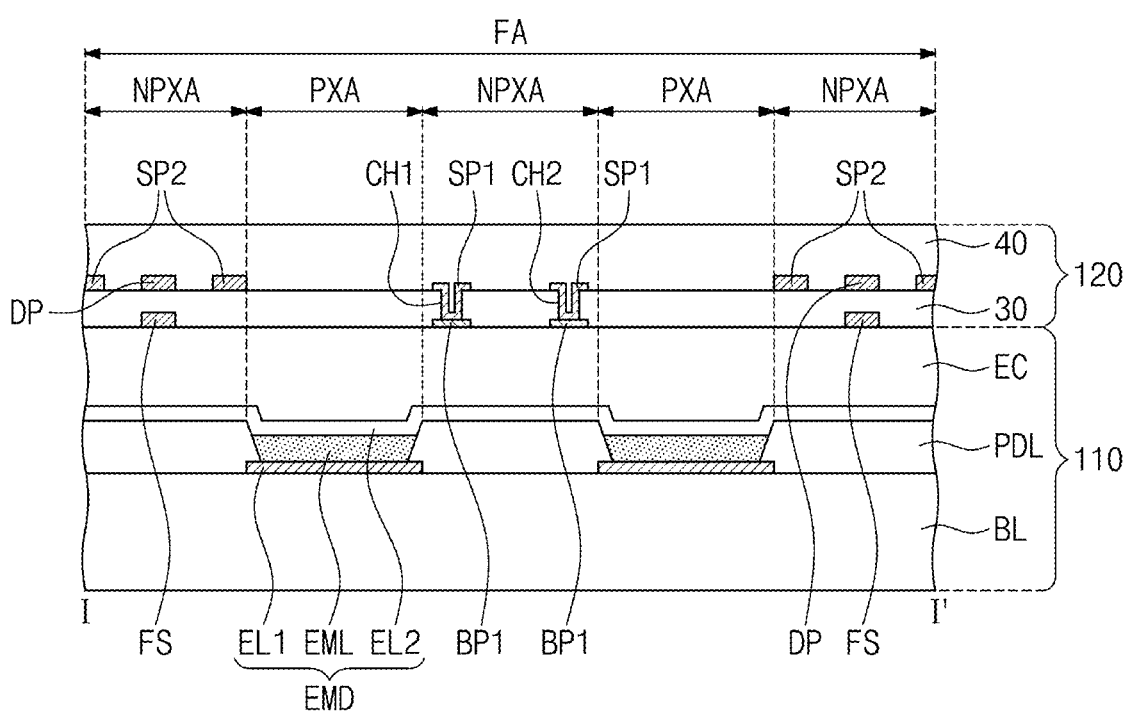
FIG. 13C is a cross-sectional view taken along line I-I' shown in FIG. 13B.

FIG. 12 is a plan view showing a display panel shown in FIG. 11. FIG. 13A is a plan view showing an input sensing unit shown in FIG. 11, FIG. 13B is a partially enlarged view of a portion B1 shown in FIG. 13A, and FIG. 13C is a cross-sectional view taken along line I-I' shown in FIG. 13B.

Referring to FIG. 12, an exemplary embodiment of the display panel 110 may include a plurality of signal lines SGL and a plurality of pixels PX. The pixels PX are arranged in an active area AA.

The signal lines SGL include gate lines GL, data lines DL, a power line PL, and a control signal line CSL. Each of the gate lines GL is connected to a corresponding pixel among the pixels PX, and each of the data lines DL is connected to a corresponding pixel among the pixels PX. The power line PL is connected to the pixels PX. The control signal line CSL provides control signals to a gate driving circuit.

Each of the pixels PX receives a gate signal from the gate line GL and a data signal from the data line DL. In addition, each of the pixels PX receives a power voltage from the power line PL. In one exemplary embodiment, for example, each of the pixels PX may include an organic light emitting element and a pixel driving circuit connected to the organic light emitting element. The pixel driving circuit may include a plurality of transistors and a capacitor.

The display device DD2 may further include a driving module DCM to drive the display panel 110. The driving module DCM may include a gate driver GDC, a flexible circuit board FPC, and a driving chip DC.

The gate driver GDC generates a plurality of gate signals and sequentially outputs the gate signals to the gate lines GL. The gate driver GDC may further output another control signal to the pixel driving circuit. The gate driver GDC may be disposed in a non-active area NAA of the display panel 110. In an exemplary embodiment, the gate driver GDC may be provided in the non-active area NAA through a same process as the pixel driving circuit. Alternatively, the gate driver GDC may be mounted on the display panel after being integrated in a chip form or may be attached to the display panel 110 after being mounted on a separate film.

The flexible circuit board FPC may be connected to one side portion of the display panel 110. The flexible circuit board FPC may electrically connect a variety of modules outside the display module 100 to the display panel 110 or gate driver GDC. The driving chip DC may be mounted on the flexible circuit board FPC.

The driving chip DC may include driving elements, e.g., a data driver, to drive the pixels. In an exemplary embodiment, the flexible circuit board FPC may be formed as a single unit, but not being limited thereto or thereby. Alternatively, the flexible circuit board FPC may be provided in a plural number and may be connected to the display panel 110.

Referring to FIGS. 12 and 13C, the display panel 110 may include a base layer BL, a pixel definition layer PDL, a light emitting element EMD, and an encapsulation layer EC. The display panel 110 may include a plurality of light emitting areas PXA and a plurality of non-light emitting areas NPXA arranged in the folding area FA. FIG. 13C shows an area in which two light emitting areas among the light emitting areas PXA are arranged.

Although not shown in figures, the base layer BL may include a plurality of insulating layers and a plurality of conductive layers. The insulating layers and the conductive layers may collectively define or form the thin film transistor and the capacitor connected to the light emitting element EMD.

The pixel definition layer PDL is disposed on the base layer BL. The pixel definition layer PDL is provided with predetermined openings defined therethrough. The openings may define the light emitting areas PXA.

The light emitting element EMD is disposed on the base layer BL. The light emitting element EMD may be disposed at positions respectively corresponding to the openings. The light emitting element EMD displays a light in response to an electrical signal applied thereto through the pixel driving circuit on the base layer BL to display the image.

In an exemplary embodiment, the light emitting element EMD may be an organic light emitting element. The light emitting element EMD includes a first electrode EL1, a light emitting layer EML, and a second electrode EL2. The light emitting element EMD activates the light emitting layer EML according to a difference in electric potential between the first electrode EL1 and the second electrode EL2 to generate the light. Therefore, the light emitting areas PXA may correspond to an area in which the light emitting layer EML is disposed.

In an exemplary embodiment, the light emitting areas PXA may have different sizes from each other. In one exemplary embodiment, for example, the light emitting areas PXA may have different sizes depending on colors of lights emitted therethrough. As the light emitting areas are provided to have sizes suitable for each of the different colors, it is possible to have a uniform light efficiency for various colors.

The encapsulation layer EC covers the light emitting element EMD. The encapsulation layer EC may include an inorganic layer and/or an organic layer. The encapsulation layer EC prevents moisture from infiltrating into the light emitting element EMD from the outside and protects the light emitting element EMD. In an exemplary embodiment, the encapsulation layer EC is disposed between the light emitting element EMD and the input sensing unit 120 to electrically separate the light emitting element EMD and the input sensing unit 120 from each other. In an exemplary embodiment, the encapsulation layer EC may be provided in a glass substrate or a plastic substrate. In such an embodiment, an inert gas may be filled between the encapsulation layer EC and the light emitting element EMD. The display panel 110 may be variously modified to have another structure and may not be limited to a specific embodiment.

In an exemplary embodiment, the input sensing unit 120 may be directly disposed on the encapsulation layer EC. In such an embodiment, the input sensing unit 120 may be formed on an upper surface of the encapsulation layer EC by a deposition or patterning process. However, this is merely exemplary, and alternatively, the display device DD2 may further include a member (not shown), such as a color filter or a buffer layer disposed between the input sensing unit 120 and the encapsulation layer EC.

In an exemplary embodiment, as shown in FIGS. 13A and 13B, the input sensing unit 120 may include a plurality of first sensing electrodes TE1 and a plurality of second sensing electrodes TE2.

The first sensing electrodes TE1 and the second sensing electrodes TE2 are arranged in the active area AA. The input sensing unit 120 may obtain information about the external input, e.g., a touch thereon, based on a variation in capacitance between the first sensing electrodes TE1 and the second sensing electrodes TE2.

The first sensing electrodes TE1 may extend in the second direction DR2 and may be arranged in the first direction DR1. Each of the first sensing electrodes TE1 may include first sensing patterns SP1 and first connection patterns BP1.

The first sensing patterns SP1 are arranged in the first direction DR1. The first sensing patterns SP1 may be disposed to be spaced apart from each other. Each of the first sensing patterns SP1 may have a lozenge shape. However, this is merely exemplary, and alternatively, the first sensing patterns SP1 may have one of other various shapes and may not be limited to a specific embodiment.

The first connection patterns BP1 may connect the first sensing patterns SP1 disposed to be spaced apart from each other in the first direction DR1. In one exemplary embodiment, for example, each of the first connection patterns BP1 is disposed between the first sensing patterns SP1 spaced apart from each other and connects the first sensing patterns SP1 to each other.

The second sensing patterns SP2 are arranged in the second direction DR2. The second sensing patterns SP2 may be disposed to be spaced apart from each other. The second sensing patterns SP2 may be disposed to be spaced apart from the first sensing patterns SP1. Each of the second sensing patterns SP2 may have a lozenge shape.

However, this is merely exemplary, and the second sensing patterns SP2 may have one of other various shapes and may not be limited to a specific embodiment.

The second connection patterns BP2 may connect the second sensing patterns SP2 disposed to be spaced apart from each other in the second direction DR2. In one exemplary embodiment, for example, each of the second connection patterns BP2 is disposed between the second sensing patterns SP2 spaced apart from each other and connects the second sensing patterns SP2 to each other. The second connection patterns BP2 may be integrally formed with the second sensing patterns SP2 as a single unitary unit.

In an exemplary embodiment, as shown in FIG. 13B, each of the first and second sensing patterns SP1 and SP2 may include a plurality of mesh lines MSL. The mesh lines MSL include a first mesh line MSL1 extending in a fourth direction DR4 and a second mesh line MSL2 extending in a fifth direction DR5 and crossing the first mesh line MSL1. The first mesh line MSL1 and the second mesh line MSL2 may form predetermined mesh openings. The mesh openings may correspond to the light emitting areas PXA shown in FIG. 13C. Accordingly, the light exiting from the display panel may be output without interfering with the mesh lines MSL.

According to an exemplary embodiment of the disclosure, the strain sensor SS may be disposed in the input sensing unit 120. The strain sensor SS may be disposed in the input sensing unit 120 to correspond to the folding area FA and may sense a variation in resistance due to the folding operation. The strain sensor SS includes strain sensing patterns FS and strain connection patterns FB.

The strain sensing patterns FS may be disposed in the folding area FA. The strain sensing patterns FS may be disposed to be spaced apart from each other. In addition, the strain sensing patterns FS may be spaced apart from the first sensing electrodes TE1 and the second sensing electrodes TE2.

The strain connection patterns FB may connect the strain sensing patterns FS disposed to be spaced apart from each other in the second direction DR2. In one exemplary embodiment, for example, each of the strain connection patterns FB is disposed between the strain sensing patterns FS spaced apart from each other to connect the strain sensing patterns FS.

In an exemplary embodiment of the disclosure, the input sensing unit 120 may further include dummy patterns DP. The dummy patterns DP are disposed to be spaced apart from the first sensing electrodes TE1, the second sensing electrodes TE2, and the strain sensing patterns FS. The dummy patterns DP may be floated from the first sensing patterns SP1 and the second sensing patterns SP2. Each of the dummy patterns DP may be surrounded by at least one of one first sensing pattern SP1 and one second sensing pattern SP2 when viewed in a plan view. Herein, "a plan view" means a top plan view or a plan view in a thickness direction of the display device. In one exemplary embodiment, for example, each of the first sensing patterns SP1 and the second sensing patterns SP2 may have a lozenge shape, and an empty space may be defined in a center area of the lozenge shape. In such an embodiment, the dummy patterns DP may be disposed in the empty space and may be electrically separated from the first sensing patterns SP1 and the second sensing patterns SP2.

In an exemplary embodiment, the dummy patterns DP are disposed in the empty space defined in the first sensing patterns SP1 and the second sensing patterns SP2, such that the shape of the first sensing patterns SP1 and the second sensing patterns SP2 may be effectively prevented from being recognized from an outside. In such an embodiment, the dummy patterns DP may prevent a parasitic capacitance from occurring between the electrodes included in the light emitting element EMD (refer to FIG. 13C) and the first sensing patterns SP1 and the second sensing patterns SP2. Thus, in such an embodiment where the input sensing unit 120 includes the dummy patterns DP, the input sensing unit 120 may secure reliability.

Referring to FIGS. 13B and 13C, first conductive layers BP1, FS, and FB are disposed on the display panel 110. In an exemplary embodiment, the first conductive layers BP1, FS, and FB may include the first connection patterns BP1, the strain sensing patterns FS, and the strain connection patterns FB.

Second conductive layers SP1, SP2, BP2, and DP are disposed on the first conductive layers BP1, FS, and FB. The second conductive layers SP1, SP2, BP2, and DP may include the first sensing patterns SP1, the second sensing patterns SP2, the second connection patterns BP2, and the dummy patterns DP.

The conductive patterns that form the first conductive layers BP1, FS, and FB and the second conductive layers SP1, SP2, BP2, and DP may be disposed not to overlap the light emitting areas PXA when viewed in a plan view. Accordingly, in an exemplary embodiment, the first conductive layers BP1, FS, and FB and the second conductive layers SP1, SP2, BP2, and DP may not affect the image IM displayed through the light emitting area PXA even though the first conductive layers BP1, FS, and FB and the second conductive layers SP1, SP2, BP2, and DP include or are formed of an opaque material or have a wide area. However, these are merely exemplary, and alternative each of the first conductive layers BP1, FS, and FB and the second conductive layers SP1, SP2, BP2, and DP may include a conductive pattern disposed to overlap at least a portion of the light emitting areas XPA and may not be limited to a specific embodiment.

A first insulating layer 30 is disposed between the first conductive layers BP1, FS, and FB and the second conductive layers SP1, SP2, BP2, and DP. The first conductive layers BP1, FS, and FB are spaced apart from and separated from the second conductive layers SP1, SP2, BP2, and DP by the first insulating layer 30 when viewed in a cross-section. In an exemplary embodiment, the first sensing pattern SP1 may be electrically connected to the first connection pattern BP1 via first and second contact holes CH1 and CH2 defined through the first insulating layer 30.

A second insulating layer 40 is disposed on the first insulating layer 30. The second insulating layer 40 may cover the second conductive layers SP1, SP2, BP2, and DP. The second insulating layer 40 protects the second conductive layers SP1, SP2, BP2, and DP from external environments.

The first insulating layer 30 and the second insulating layer 40 have an insulating property and may be optically transparent. Therefore, although the light emitting area PXA is covered by the first insulating layer 30 and the second insulating layer 40, the light generated from the light emitting area PXA may be easily recognized at an upper portion of the input sensing unit 120.

Each of the first insulating layer 30 and the second insulating layer 40 may include an inorganic layer and/or an organic layer.

Figure 14A:
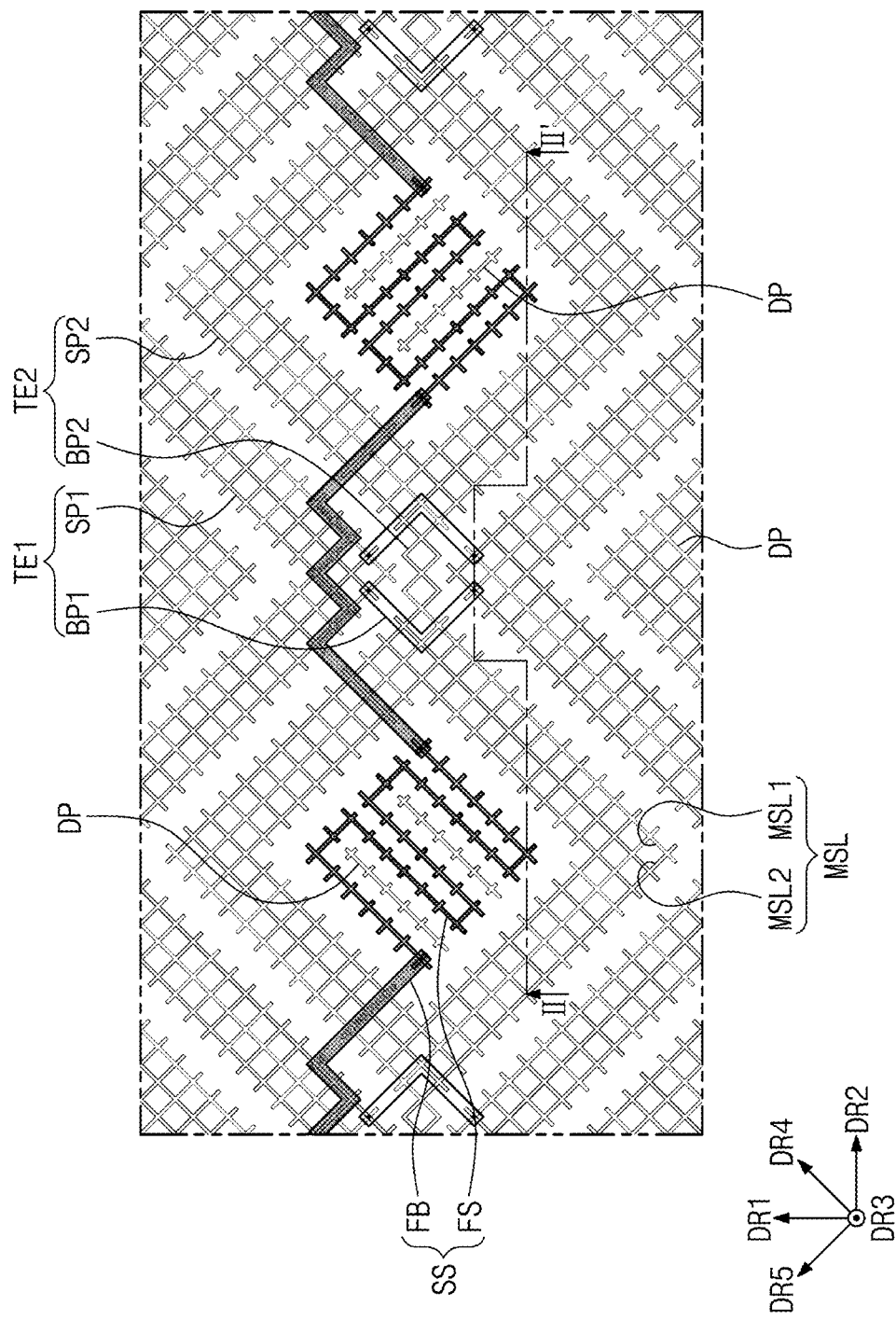
FIG. 14A is a partially enlarged view of a portion B1 of FIG. 13A according to an alternative exemplary embodiment of the disclosure.
Figure 14B:
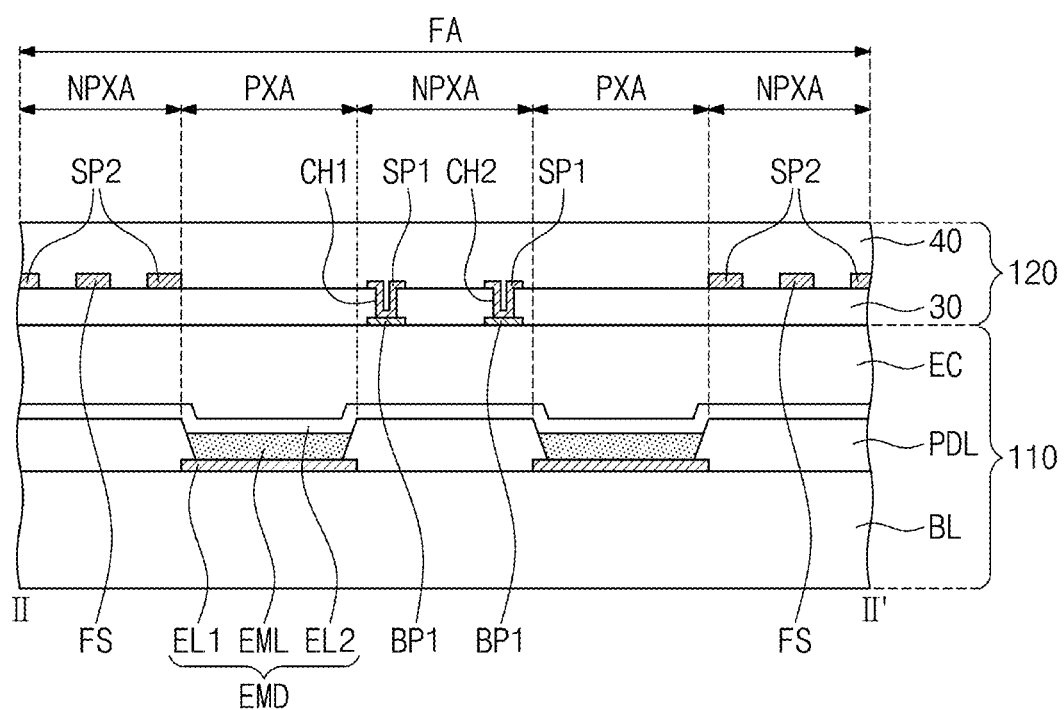
FIG. 14B is a cross-sectional view taken along line II-IF shown in FIG. 14A.

FIG. 14A is a partially enlarged view of the portion B1 of FIG. 13A according to an alternative exemplary embodiment of the disclosure, and FIG. 14B is a cross-sectional view taken along line II-IF shown in FIG. 14A.

Referring to FIGS. 14A and 14B, in an exemplary embodiment, first conductive layers BP1 and FB may include the first connection patterns BP1 and the strain connection patterns FB.

Second conductive layers SP1, SP2, BP2, DP, and FS are disposed on the first conductive layers BP1 and FB. The second conductive layers SP1, SP2, BP2, DP, and FS may include the first sensing patterns SP1, the second sensing patterns SP2, the second connection patterns BP2, the dummy patterns DP, and the strain sensing patterns FS.

The dummy patterns DP may be floated from the first sensing patterns SP1 and the second sensing patterns SP2. The strain sensing patterns FS may be disposed in a same layer as the dummy patterns DP and may be disposed to be spaced apart from the dummy patterns DP.

Figure 15:
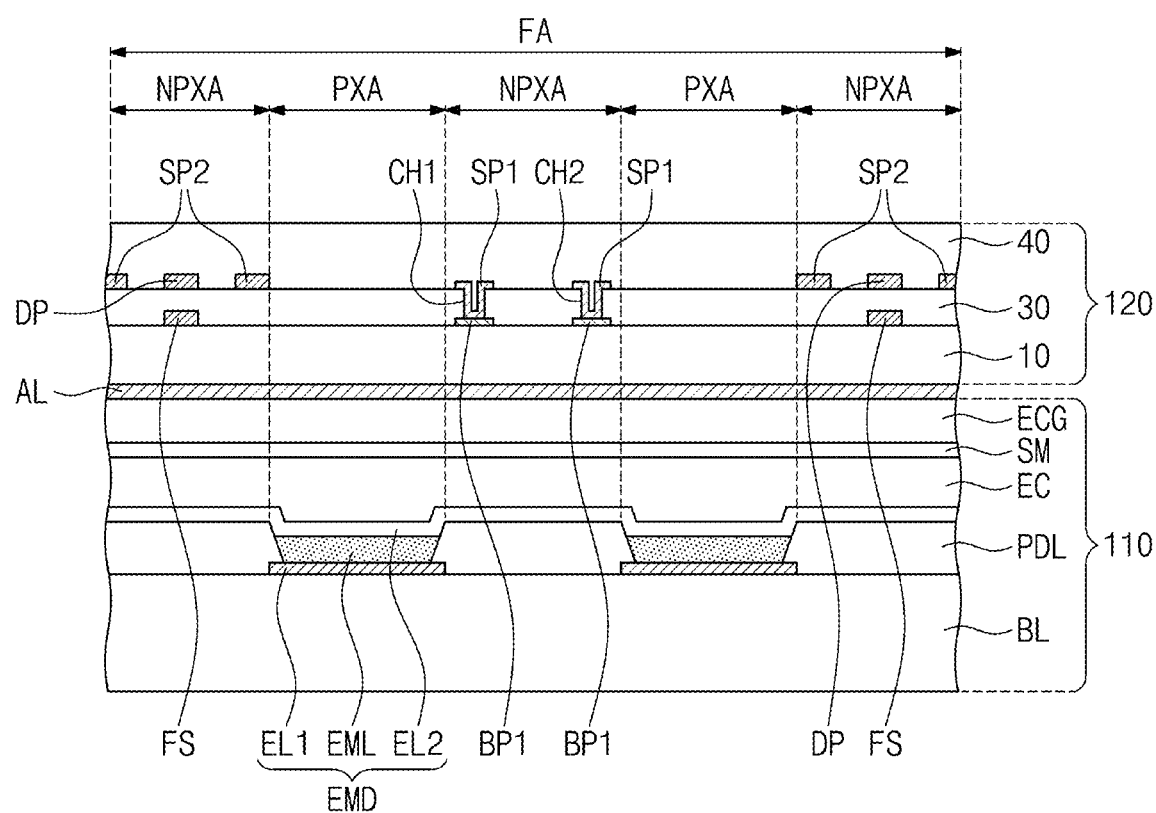
FIG. 15 is a cross-sectional view showing a display module according to an exemplary embodiment of the disclosure.

FIG. 15 is a cross-sectional view showing a display module according to an exemplary embodiment of the disclosure. More particularly, FIG. 15 shows a structure in which the input sensing panel is disposed on the display panel.

Referring to FIG. 15, an exemplary embodiment of the display panel 110 may further include an encapsulation substrate ECG disposed on the encapsulation layer EC. The encapsulation substrate ECG may be a glass substrate, a metal substrate, or a plastic substrate, but not being limited thereto or thereby. The display panel 110 may further include a sealing layer SM interposed between the encapsulation substrate ECG and the encapsulation layer EC. The sealing layer SM disposed between the encapsulation substrate ECG and the encapsulation layer EC forms a cell gap between the encapsulation substrate ECG and the encapsulation layer EC, and couples and seals the encapsulation substrate ECG and the encapsulation layer EC.

The input sensing panel 120 may be disposed on the encapsulation substrate ECG The input sensing panel 120 includes the base layer 10 and includes first and second conductive layers and first and second insulating layers 30 and 40, which are disposed above the base layer 10. The base layer 10 may be or include a glass substrate, a metal substrate, or a plastic substrate, but not being limited thereto or thereby. The base layer 10 may include an inorganic layer, an organic layer, or a composite layer.

The first conductive layers BP1, FS, and FB are disposed on the base layer 10. The second conductive layers SP1, SP2, BP2, and DP are disposed on the first conductive layers BP1, FS, and FB. The first insulating layer 30 is disposed between the first conductive layers BP1, FS, and FB and the second conductive layers SP1, SP2, BP2, and DP. The first conductive layers BP1, FS, and FB are spaced apart from and separated from the second conductive layers SP1, SP2, BP2, and DP by the first insulating layer 30 when viewed in a cross-section. The second insulating layer 40 is disposed on the first insulating layer 30. The second insulating layer 40 may cover the second conductive layers SP1, SP2, BP2, and DP. The second insulating layer 40 protects the second conductive layers SP1, SP2, BP2, and DP from external environment.

The input sensing panel 120 may be attached to an upper surface of the display panel by an adhesive layer AL. The adhesive layer AL may include an optically transparent material. The optically transparent material may be an optically clear adhesive film, an optically clear resin, or a pressure sensitive adhesive film.

Figure 16:
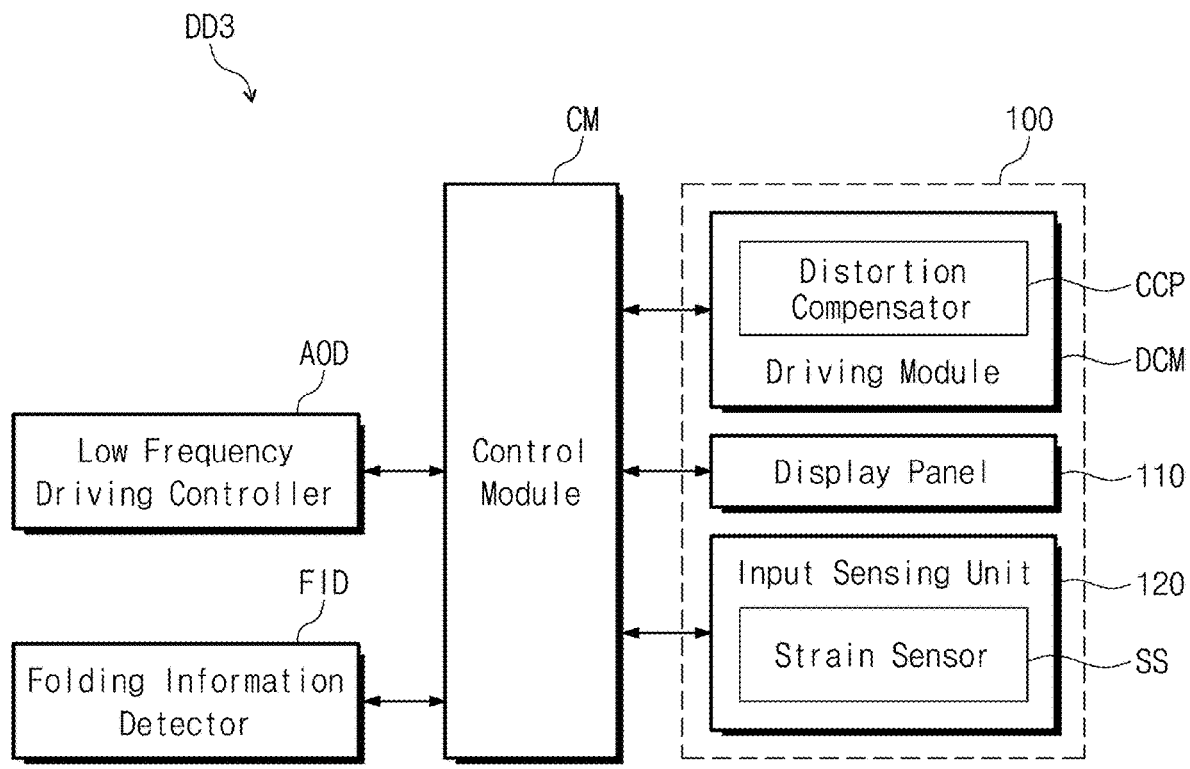
FIG. 16 is a block diagram showing a display device according to an exemplary embodiment of the disclosure.
Figure 17:
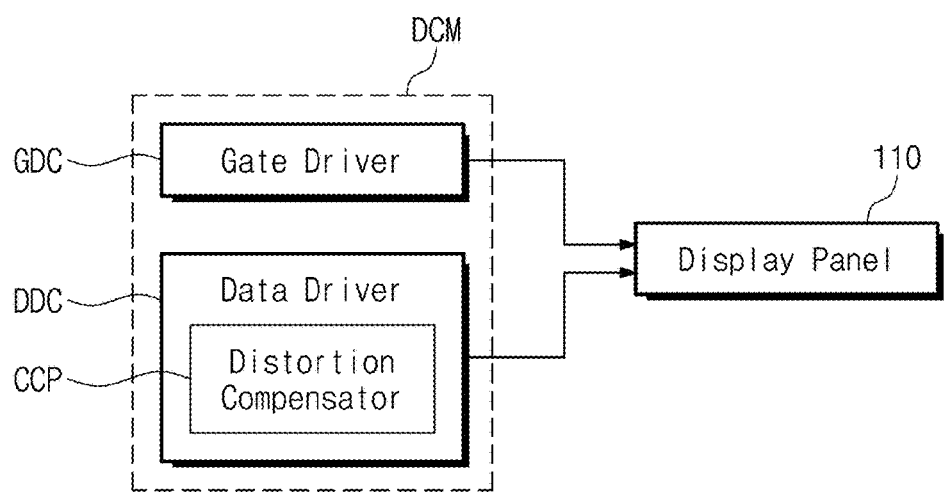
FIG. 17 is a block diagram showing a driving module shown in FIG. 16.

FIG. 16 is a block diagram showing a display device according to an exemplary embodiment of the disclosure, and FIG. 17 is a block diagram showing a driving module shown in FIG. 16.

Referring to FIG. 16, an exemplary embodiment of a display device DD3 may further include a lower frequency driving controller AOD. The lower frequency driving controller AOD outputs a power control signal for a normal operation mode operating at a reference frequency and a low frequency operation mode operating at a frequency lower than the reference frequency. A driving module DCM receives the power control signal and is operated in the normal operation mode or the low frequency operation mode based on the power control signal.

The driving module DCM may be operated at the reference frequency, e.g., about 60 hertz (Hz), in the normal operation mode and may be operated at a frequency (hereinafter, referred to as a "low frequency", e.g., 1 Hz) lower than the reference frequency in the low frequency operation mode. Operation of the driving module DCM in the low frequency operation mode may include that one or more of circuits forming the driving module DCM are operated in the low frequency operation mode.

When the driving module DCM is operated in the low frequency operation mode, a power consumed in the driving module DCM may be reduced, such that an overall power consumption of the display device DD3 may be reduced.

Referring to FIG. 17, an exemplary embodiment of the driving module DCM includes a gate driver GDC and a data driver DDC. The gate driver GDC applies the gate signal to the gate line GL (refer to FIG. 12) of the display panel 110, and the data driver DDC applies the data signal to the data line DL (refer to FIG. 12) of the display panel 110.

One of the gate driver GDC and the data driver DDC may receive the power control signal and may be operated in the low frequency operation mode, or both the gate driver GDC and the data driver DDC may receive the power control signal and may be operated in the low frequency operation mode.

An exemplary embodiment of the data driver DDC ac may include a distortion compensator CCP. The distortion compensator CCP receives the folding information and compensates for a distortion of the image displayed through the folding area FA. The distortion compensator CCP is turned on in the low frequency operation mode and compensates for the distortion in the folding area FA.

The distortion compensator CCP may receive image data. In an exemplary embodiment, the image data provided to the distortion compensator CCP may be data processed by some circuits included in the data driver DCC and may be data before being supplied to an input terminal of the data driver DCC (i.e., before being processed).

The distortion compensator CCP performs a compensation process using the image data and pre-stored compensation data. In an exemplary embodiment, the distortion compensator CCP may output synthesized data obtained by synthesizing the image data and the compensation data. The distortion compensation process of the distortion compensator CCP will hereinafter be described in greater with reference to FIGS. 18 and 19.

Figure 18:
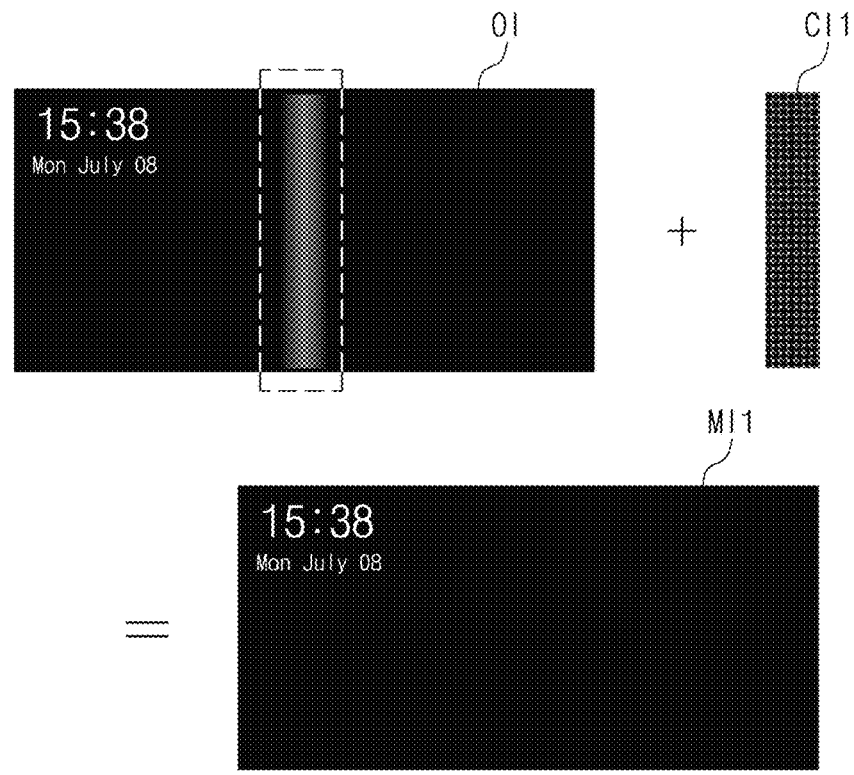
FIG. 18 is a conceptual view showing a distortion compensation process according to an exemplary embodiment of the disclosure.
Figure 19:
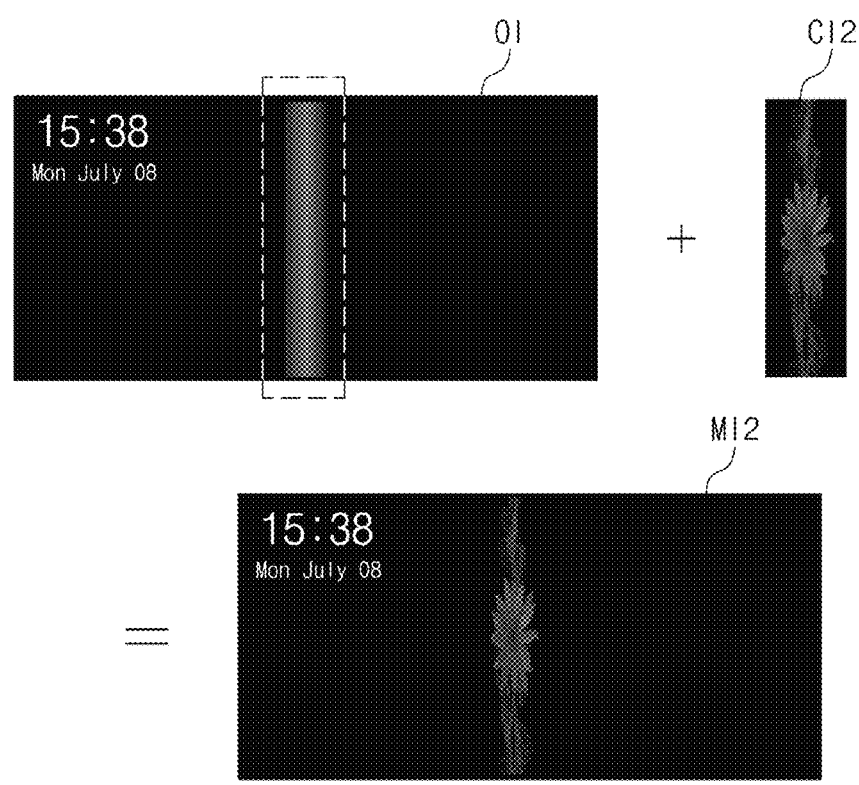
FIG. 19 is a conceptual view showing a distortion compensation process according to an exemplary embodiment of the disclosure.

FIG. 18 is a conceptual view showing a distortion compensation process according to an exemplary embodiment of the disclosure, and FIG. 19 is a conceptual view showing a distortion compensation process according to an exemplary embodiment of the disclosure.

Referring to FIGS. 16 and 18, the distortion compensator CCP may output synthesized data obtained by synthesizing the image data and the compensation data.

A raw image OI based on the image data corresponding to the entire area of the display panel 110, a compensation pattern image CI1 based on the compensation data, and a synthesized image MI1 based on the synthesized data are shown in FIG. 18. In this case, the compensation pattern image CI1 may include a predetermined pattern in the folding area FA. The compensation data may be data that are set to allow the predetermined pattern to be displayed in the folding area FA. The compensation pattern image CI1 based on the compensation data may include a mosaic pattern. In an exemplary embodiment, a dark portion and a bright portion may repeatedly appear in the compensation pattern image CD in a matrix direction.

The synthesized image MI1 may be an image obtained by synthesizing the raw image OI and the compensation pattern image CI1. Since the compensation pattern image CD reduces a luminance deviation in the raw image OI, the luminance deviation due to the flexural strain may not be visually recognized in the synthesized image MI1.

Accordingly, as shown in FIG. 18, the display device DD3 may display the image in which the luminance deviation due to the flexural strain in the folding area FA is reduced on an entire screen, and as a result, a display quality of the display device DD3 may be improved.

Referring to FIGS. 16 and 19, the compensation data may be data to display a predetermined compensation image in the folding area.

A raw image OI based on the image data corresponding to the entire area of the display panel 110, a compensation image CI2 based on the compensation data, and a synthesized image MI2 based on the synthesized data are shown in FIG. 19. In this case, the compensation image CI2 may include a predetermined pattern in the folding area FA. The compensation data may be data that are set to allow the predetermined pattern to be displayed in the folding area FA. The compensation image CI2 based on the compensation data may include a specific pattern. In an exemplary embodiment, the compensation image CI2 may be a flower image displayed along the folding area FA, for example. Alternatively, various image may be used as the compensation image CI2 rather than the flower image.

The synthesized image MI2 may be an image obtained by synthesizing the raw image OI and the compensation image CI2. Since the compensation image CI2 is displayed in the folding area FA, it is possible to reduce a visibility of the luminance deviation in the raw image OI.

Accordingly, as shown in FIG. 19, the display device DD3 may display the image in which the luminance deviation due to the flexural strain in the folding area FA is reduced, and as a result, a display quality of the display device DD3 may be improved.

In an exemplary embodiment, as described above, the synthesized data compensated by the distortion compensator CCP are provided to some circuits or the input terminal of the data driver DCC. The data driver DCC may convert the synthesized data to data signals and may apply the data signals to the data line DL.

Figure 20:
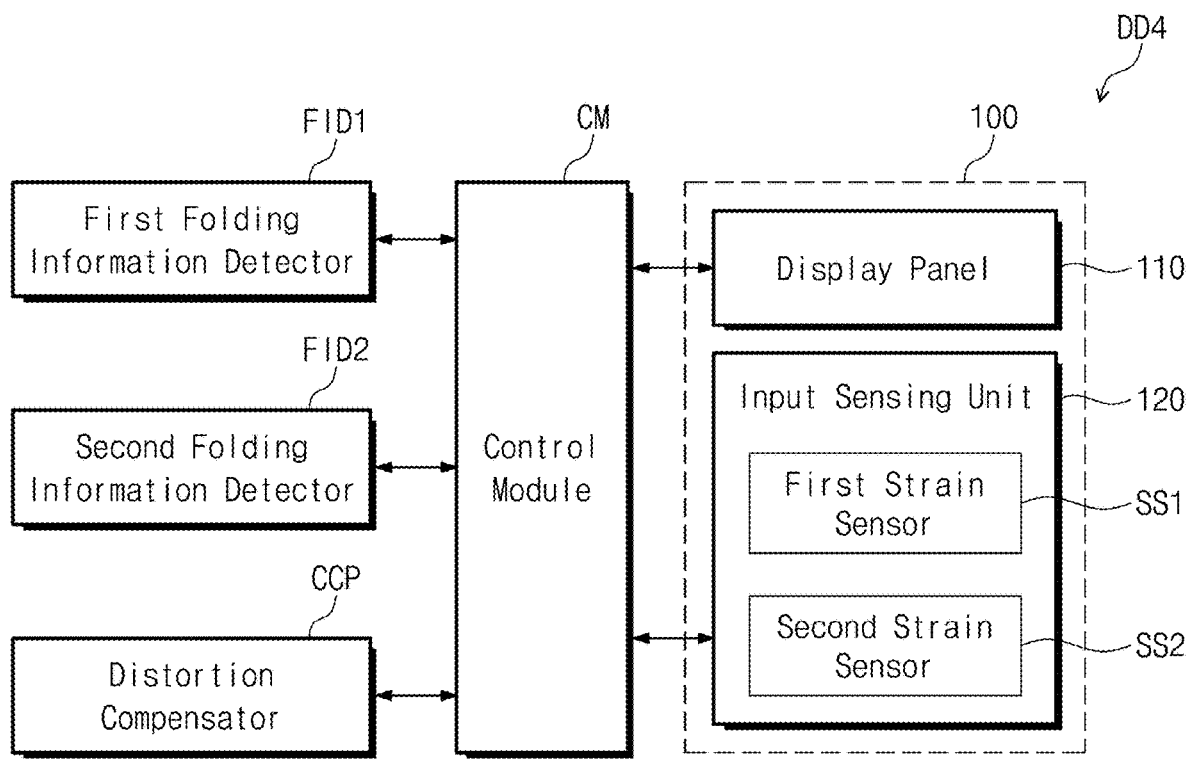
FIG. 20 is a block diagram showing a display device according to an exemplary embodiment of the disclosure.
Figure 21:
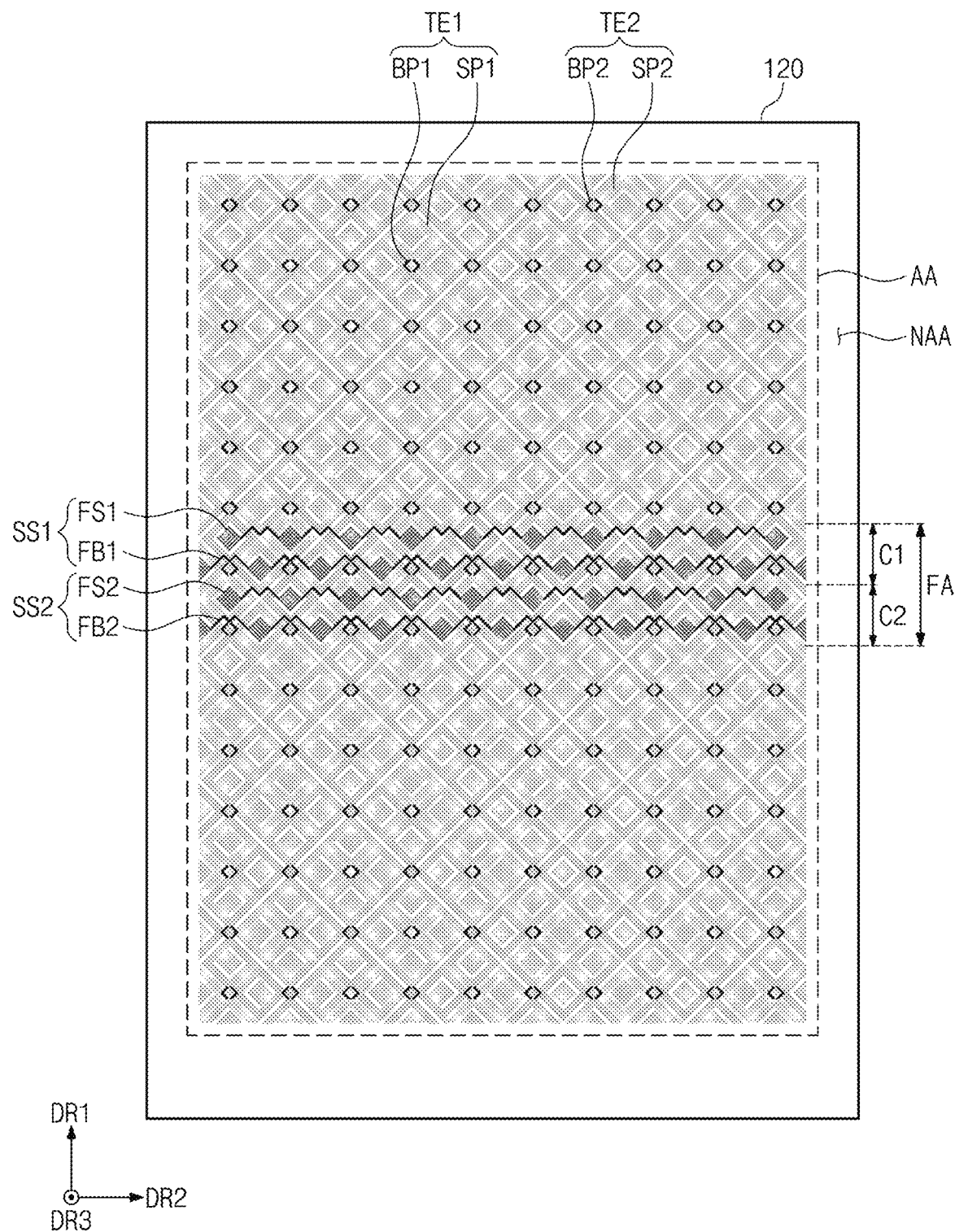
FIG. 21 is a block diagram showing an input sensing unit according to an exemplary embodiment of the disclosure.
Figure 22:
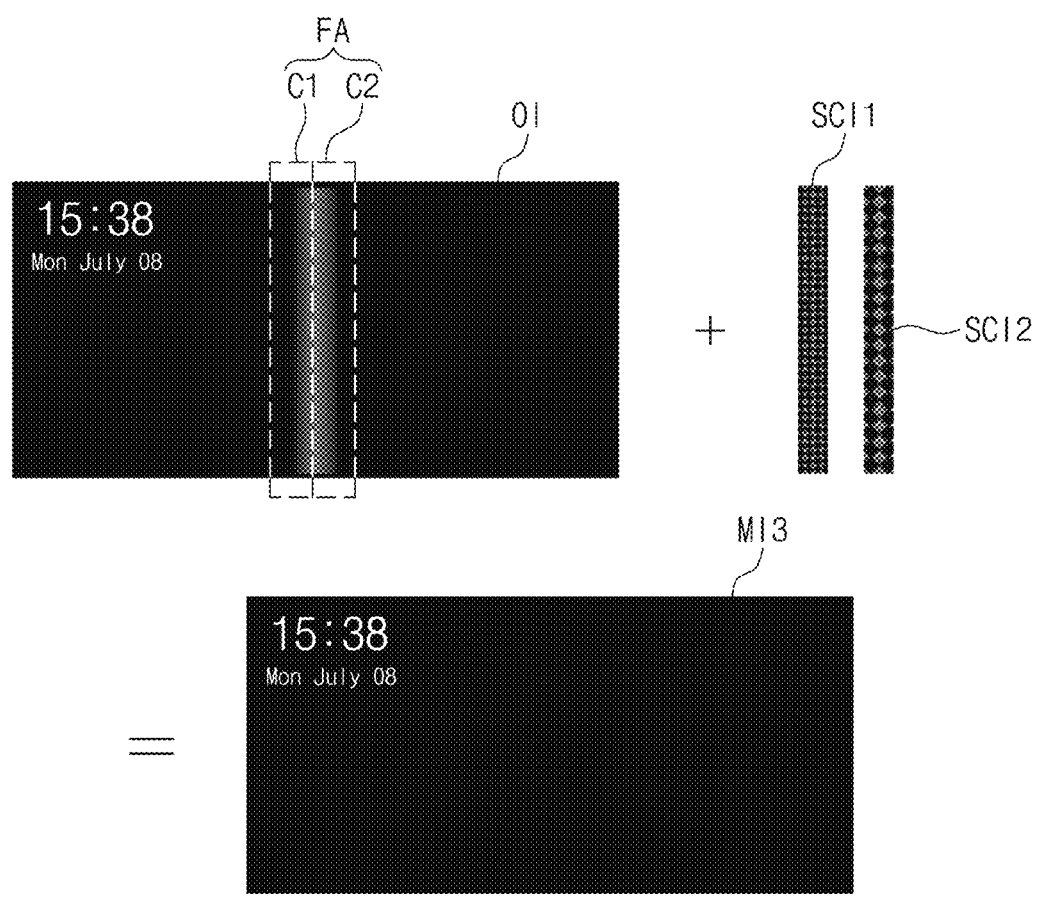
FIG. 22 is a conceptual view showing a distortion compensation process according to an exemplary embodiment of the disclosure.

FIG. 20 is a block diagram showing a display device according to an exemplary embodiment of the disclosure, FIG. 21 is a block diagram showing an input sensing unit according to an exemplary embodiment of the disclosure, and FIG. 22 is a conceptual view showing a distortion compensation process according to an exemplary embodiment of the disclosure.

Referring to FIGS. 20 and 21, an exemplary embodiment of a display device DD4 may include first and second folding information detectors FID1 and FID2. The first folding information detector FID1 detects folding information about a first detection area C1 of a folding area FA, and the second folding information detector FID2 detects folding information about a second detection area C2 of the folding area FA. The first and second detection areas C1 and C2 may be areas defined by dividing the folding area FA into two areas with respect to the folding axis FX (refer to FIG. 1A).

In an exemplary embodiment of the disclosure, a flexural strain amount of the first detection area C1 may be different from a flexural strain amount of the second detection area C2. In such an embodiment, since the first and second folding information detectors FID1 and FID2 detect the folding information about the first and second detection areas C1 and C2, respectively, different distortion compensations from each other may be performed on the detection areas, respectively.

The display device DD4 includes a first strain sensor SS1 disposed in the input sensing unit 120 to correspond to the first detection area C1 and a second strain sensor SS2 disposed in the input sensing unit 120 to correspond to the second detection area C2. The first strain sensor SS1 may include first strain sensing patterns FS1 and first strain connection patterns FB1, and the second strain sensor SS2 may include second strain sensing patterns FS2 and second strain connection patterns FB2. The first and second strain sensors SS1 and SS2 may determine whether the display device DD4 is in a folded state and/or an unfolded state. A strain value measured by the first strain sensor SS1 may be provided to the first folding information detector FID1, and a strain value measured by the second strain sensor SS2 may be provided to the second folding information detector FID2. The first and second folding information detectors FID1 and FID2 may detect the flexural strain amount in the first and second detection areas C1 and C2 based on the strain values respectively output from the first and second strain sensors SS1 and SS2.

The distortion compensator CCP may compensate for the distortion with respect to the first and second detection areas C1 and C2. The distortion compensator CCP may output the synthesized data obtained by synthesizing first compensation data with respect to the first detection area C1 and second compensation data with respect to the second detection area C2 with the image data.

In an exemplary embodiment, as shown in FIG. 22, a raw image OI based on the image data corresponding to the entire area of the display panel 110 is synthesized with a first compensation pattern image SCI1 based on the first compensation data and a second compensation pattern image SCI2 based on the second compensation data. Accordingly, the display device DD4 may display a synthesized image MI3 based on the synthesized data. In such an embodiment, the first compensation pattern image SCI1 may include a predetermined pattern in the first detection area C1, and the second compensation pattern image SCI2 may include a predetermined pattern in the second detection area C2.

FIG. 22 shows an exemplary embodiment in which the flexural strain amount of the first detection area C1 is larger than that of the second detection area C2, and in such an embodiment, a mosaic pattern included in the first compensation pattern image SCI1 is finer than a mosaic pattern included in the second compensation pattern area SCI2, for example. However, the disclosure may not be limited thereto or thereby.

The synthesized image MI3 may be an image obtained by synthesizing the raw image OI and the first and second compensation pattern images SCI1 and SCI2. In such an embodiment, the first and second compensation pattern images SCI1 and SCI2 reduce the luminance deviation in the raw image OI, such that the luminance deviation due to the flexural strain may not be visually recognized in the synthesized image MI3.

Accordingly, an exemplary embodiment, the display device DD4 may display the image in which the luminance deviation due to the flexural strain in the folding area FA is reduced on an entire screen, and as a result, a display quality of the display device DD4 may be improved.

Figure 23:
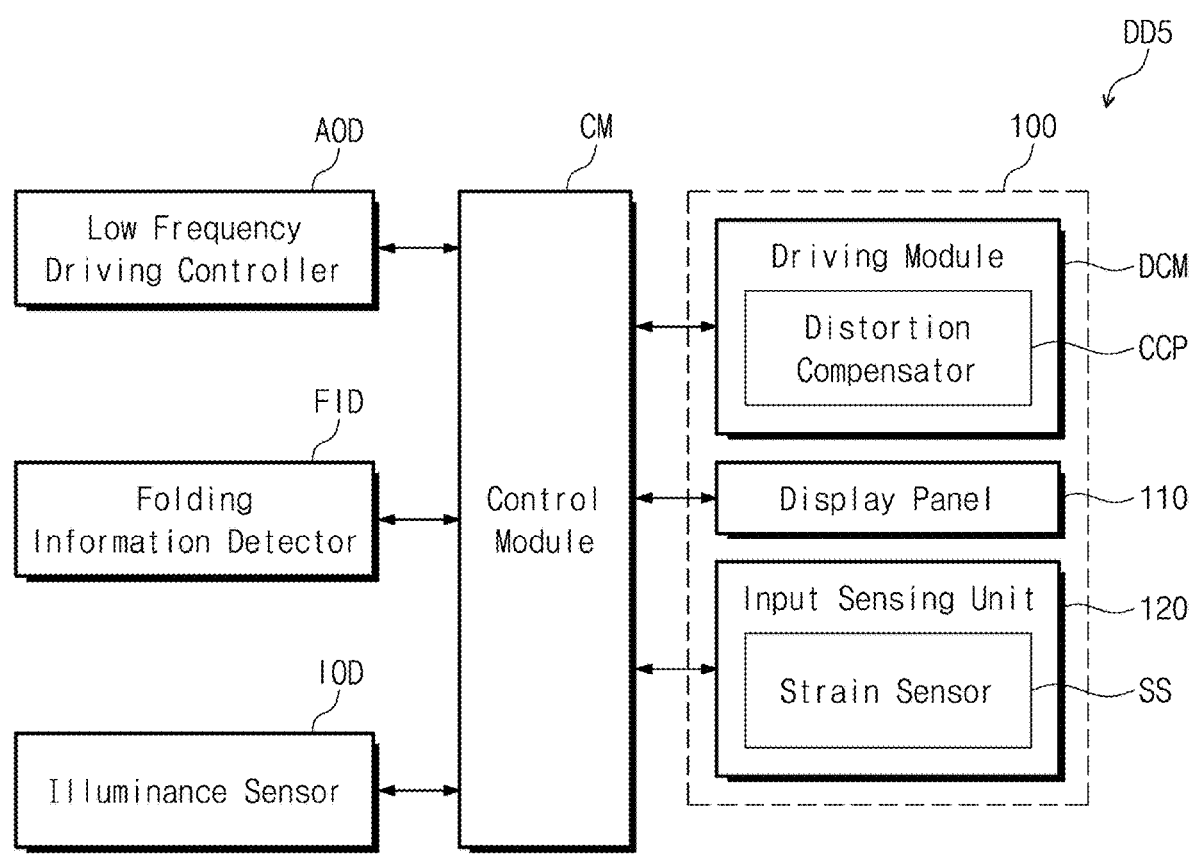
FIG. 23 is a block diagram showing a display device according to an exemplary embodiment of the disclosure.
Figure 24:
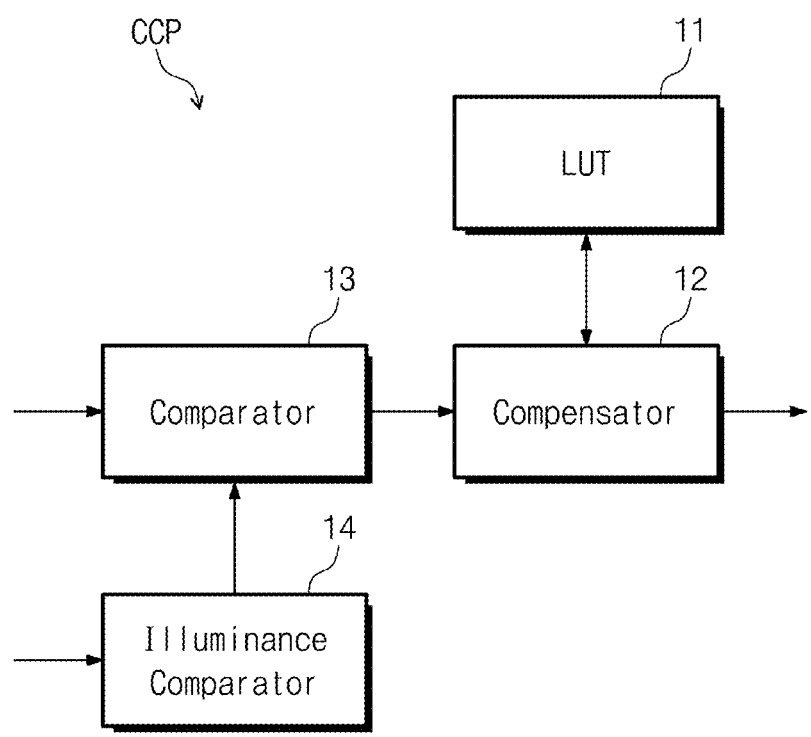
FIG. 24 is a block diagram showing a distortion compensator shown in FIG. 23.

FIG. 23 is a block diagram showing a display device according to an exemplary embodiment of the disclosure, and FIG. 24 is a block diagram showing a distortion compensator shown in FIG. 23.

Referring to FIGS. 23 and 24, an exemplary embodiment of a display device DD5 may further include an illuminance sensor IOD. The illuminance sensor IOD may be disposed in the housing 200 (refer to FIG. 3A) of the display device DD5 to measure an ambient illuminance.

The distortion compensator CCP may further include an illuminance comparator 14 to compare the ambient illuminance with a predetermined reference illuminance value. When the ambient illuminance is lower than the reference illuminance value according to the compared result of the illuminance comparator 14, the comparator 13 and the compensator 12 may be turned off. In such an embodiment, when the ambient illuminance is lower than the reference illuminance value, the distortion in the folding area FA may not be recognized, and thus the distortion compensation may not operate. Therefore, the distortion compensation may not be carried out.

When the ambient illuminance is higher than the reference illuminance value according to the compared result of the illuminance comparator 14, the comparator 13 and the compensator 12 may be turned on. In such an embodiment, when the ambient illuminance is higher than the reference illuminance value, the distortion in the folding area FA may be recognized, and thus the distortion compensation may operate. Therefore, the distortion compensation may be carried out.

In an exemplary embodiment of the disclosure, the reference illuminance value may be about 200 candela per square meter (cd/m2). However, the reference illuminance value may vary depending on the cumulative folding time and the cumulative folding count. That is, when the cumulative folding time and the cumulative folding count increase, the reference illuminance value may be increased to be higher than an initial reference illuminance value.

Herein, an exemplary embodiment having a structure in which the comparator 13 and the compensator 12 are turned on or turned off according to the ambient illuminance has been described, however, the disclosure should not be limited thereto or thereby. In an alternative exemplary embodiment, a compensation amount of the distortion compensation may be adjusted based on the ambient illuminance. In such an embodiment, when the ambient illuminance is lower than the reference illuminance value, the distortion compensation amount is set to be small, and when the ambient illuminance is higher than the reference illuminance value, the distortion compensation amount is set to be large.

Accordingly, an exemplary embodiment of the display device DD5 may prevent the luminance deviation due to the flexural strain in the folding area FA from being visually recognized throughout the screen irrespective of the ambient illuminance, and as a result, a display quality of the display device DD5 may be improved.

Figure 25:
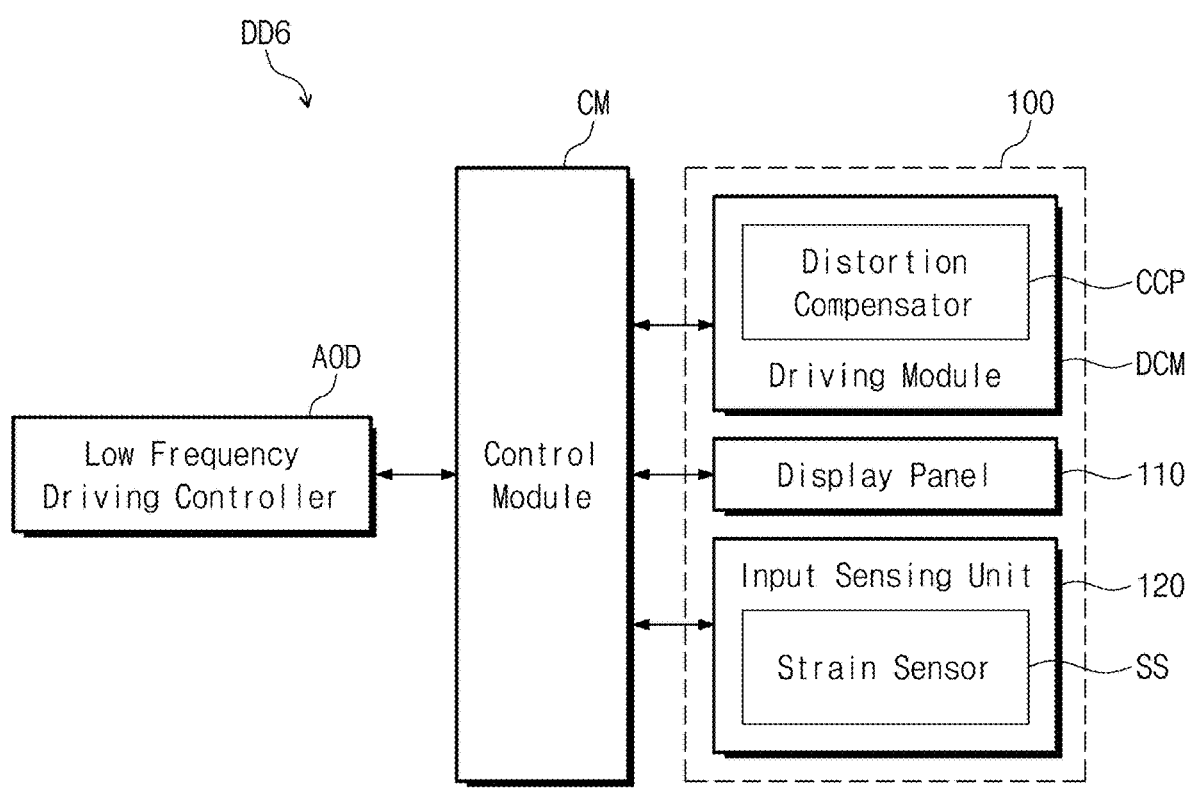
FIG. 25 is a block diagram showing a display device according to an exemplary embodiment of the disclosure.

FIG. 25 is a block diagram showing a display device according to an exemplary embodiment of the disclosure.

Referring to FIG. 25, an exemplary embodiment of a display device DD6 may not include the folding information detector as compared with the display device DD3 shown in FIG. 16. In such an embodiment, the display device DD6 may generate folding information about the display device DD6 based on a strain value provided from a strain sensor SS. In such an embodiment, a control module CM reads out a corresponding strain amount from an LUT based on the strain value provided from the strain sensor SS and outputs the read-out strain amount as the folding information.

A distortion compensator CCP receives the folding information in response to a control signal and compensates for the distortion of the image displayed through the folding area FA (refer to FIG. 1A). The other structure and function of the distortion compensator CCP are similar to those described above with reference to FIGS. 7 to 24, and any repetitive detailed description thereof will be omitted.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device comprising:
   a display panel which displays an image, wherein the display panel includes a folding area folded with respect to an imaginary folding axis and a plurality of non-folding areas adjacent to the folding area when viewed in a plan view;
   a folding information detector which detects folding information about the display panel;
   a control module which outputs a control signal based on the folding information provided from the folding information detector; and
   a distortion compensator which compensates for a distortion of the image due to a height difference between portions of the folding area when the display panel is in an unfolded state in response to the control signal.

2. The display device of claim 1, wherein the folding information detector comprises:
a measuring unit which measures cumulative information about a folding operation of the display panel;
a folding information generating unit which generates the folding information based on the cumulative information; and
a folding information storing unit which stores the folding information.

3. The display device of claim 2, wherein the measuring unit comprises a cumulative time measuring unit which measures a cumulative folding time of the display panel.

4. The display device of claim 3, wherein the measuring unit further comprises a cumulative count measuring unit which measures a cumulative folding count of the display panel.

5. The display device of claim 4, wherein
the folding information generating unit further comprises a lookup table in which a strain amount is stored based on the folding time and the folding count, and
the folding information generating unit reads out a corresponding strain amount from the lookup table based on the cumulative folding time and the cumulative folding count and outputs the corresponding strain amount read out from the lookup table as the folding information.

6. The display device of claim 4, wherein
the measuring unit further comprises a strain sensor disposed on the display panel, and
the cumulative time measuring unit and the cumulative count measuring unit respectively calculate the cumulative folding time and the cumulative folding count based on a value measured by the strain sensor.

7. The display device of claim 6, further comprising:
an input sensing unit disposed on the display panel,
wherein the strain sensor is disposed in the input sensing unit.

8. The display device of claim 2, wherein the distortion compensator comprises:
a lookup table in which compensation data corresponding to the folding information are stored; and
a compensator which receives image data, receives the compensation data from the lookup table, and outputs synthesized data obtained by synthesizing the compensation data and the image data.

9. The display device of claim 8, wherein
the distortion compensator further comprises a comparator which compares the folding information with a predetermined reference value,
the compensator is turned off when the folding information is smaller than the predetermined reference value, and
the compensator is turned on when the folding information is greater than the predetermined reference value.

10. The display device of claim 8, wherein the compensation data are data set to allow a predetermined compensation pattern to be displayed in the folding area.

11. The display device of claim 8, wherein the compensation data are data set to allow a predetermined image to be displayed in the folding area.

12. The display device of claim 8, further comprising:
a lower frequency driving controller which outputs a power control signal based on a normal operation mode operating at a reference frequency or a low frequency operation mode operating at a frequency lower than the reference frequency.

13. The display device of claim 12, further comprising:
a data driver connected to the display panel,
wherein the display panel comprises a pixel connected to a gate line and a data line, and
the data driver outputs a data signal to the data line and operates in the low frequency operation mode by the power control signal.

14. The display device of claim 13, wherein the distortion compensator is disposed in the data driver and is turned on in the low frequency operation mode to compensate for a distortion in the folding area.

15. The display device of claim 13, wherein
the synthesized data output from the distortion compensator are provided to the data driver, and
the data driver converts the synthesized data to the data signal and applies the data signal to the data line.

16. The display device of claim 8, further comprising:
an illuminance sensor which measures an ambient illuminance.

17. The display device of claim 16, wherein the distortion compensator further comprises an illuminance comparator which compares the ambient illuminance measured by the illuminance sensor with a predetermined reference value.

18. The display device of claim 17, wherein
the compensator is turned off when the ambient illuminance is lower than a reference illuminance value, and
the compensator is turned on when the ambient illuminance is higher than the reference illuminance value.

19. The display device of claim 18, wherein the reference illuminance value is about 200 candela per square meter.

20. The display device of claim 1, wherein the display panel comprises a flexible display panel comprising an organic light emitting element.

21. The display device of claim 1, wherein the folding information detector comprises:
a first folding information detector which detects folding information about a first detection area of the folding area; and
a second folding information detector which detects folding information about a second detection area of the folding area.

22. The display device of claim 21, further comprising:
an input sensing unit disposed on the display panel;
a first strain sensor disposed in the input sensing unit and corresponding to the first detection area; and
a second strain sensor disposed in the input sensing unit and corresponding to the second detection area.

23. The display device of claim 22, wherein
the first folding information detector generates folding information about the first detection area based on a strain value measured by the first strain sensor,
the second folding information detector generates folding information about the second detection area based on a strain value measured by the second strain sensor, and
the distortion compensator performs compensations for the first and second detection areas, independently of each other.

24. A display device comprising:
a display panel which displays an image, wherein the display panel includes a folding area folded with respect to an imaginary folding axis and a plurality of non-folding areas adjacent to the folding area when viewed in a plan view;

an input sensing unit disposed on the display panel, wherein the input sensing unit comprises a strain sensor which detects folding information of the display panel;

a control module which outputs a control signal based on the folding information provided from the strain sensor; and a distortion compensator which compensates for a distortion of the image due to a height difference between portions of the folding area when the display panel is in an unfolded state in response to the control signal.

* * * * *